United States Patent [19]
Mountsier et al.

[11] Patent Number: 5,810,933
[45] Date of Patent: Sep. 22, 1998

[54] WAFER COOLING DEVICE

[75] Inventors: Thomas Mountsier, San Jose; James Wing, Los Altos, both of Calif.

[73] Assignee: Novellus Systems, Inc., San Jose, Calif.

[21] Appl. No.: 602,432

[22] Filed: Feb. 16, 1996

[51] Int. Cl.$^6$ .............................. C23C 16/00; C23C 14/50
[52] U.S. Cl. ...................... 118/724; 118/723 E; 118/728; 118/500; 118/666; 204/298.09; 204/298.15; 156/345; 165/80.4; 165/275; 279/128; 361/234
[58] Field of Search ................................. 118/723 E, 724, 118/728, 500, 666; 204/298.09, 298.15; 156/345; 361/234; 279/128; 165/275, 80.4

[56] References Cited

U.S. PATENT DOCUMENTS

| | | | |
|---|---|---|---|
| 4,184,188 | 1/1980 | Briglia | 361/234 |
| 4,384,918 | 5/1983 | Abe | 156/643 |
| 4,502,094 | 2/1985 | Lewin et al. | 361/234 |
| 4,508,161 | 4/1985 | Holden | 165/1 |
| 4,680,061 | 7/1987 | Lamont, Jr. | 148/1.5 |
| 4,743,570 | 5/1988 | Lamont, Jr. | 437/248 |
| 4,771,730 | 9/1988 | Tezuka | 118/723 |
| 4,909,314 | 3/1990 | Lamont, Jr. | 165/80.3 |
| 5,155,652 | 10/1992 | Logan et al. | 361/234 |
| 5,160,152 | 11/1992 | Toraguchi et al. | 279/128 |
| 5,203,958 | 4/1993 | Arai et al. | 156/643 |
| 5,213,349 | 5/1993 | Elliott | 279/128 |
| 5,223,113 | 6/1993 | Kaneko et al. | 204/298.33 |
| 5,255,153 | 10/1993 | Nozawa et al. | 361/234 |
| 5,267,607 | 12/1993 | Wada | 165/80.1 |
| 5,320,982 | 6/1994 | Tsubone et al. | 437/228 |
| 5,345,999 | 9/1994 | Hosokawa | 165/80.2 |
| 5,346,578 | 9/1994 | Benzing et al. | 156/345 |
| 5,366,002 | 11/1994 | Tepman | 165/1 |
| 5,382,311 | 1/1995 | Ishikawa et al. | 156/345 |
| 5,460,684 | 10/1995 | Saeki et al. | 156/345 |
| 5,474,614 | 12/1995 | Robbins | 118/728 |
| 5,478,429 | 12/1995 | Komino et al. | 156/345 |
| 5,484,011 | 1/1996 | Tepman et al. | 165/1 |

(List continued on next page.)

FOREIGN PATENT DOCUMENTS

| | | |
|---|---|---|
| 0 452 222 A1 | 10/1991 | European Pat. Off. . |
| 0 488 307 A2 | 11/1991 | European Pat. Off. . |
| 0 462 563 A1 | 12/1991 | European Pat. Off. . |
| 0 644 577 A | 6/1994 | European Pat. Off. . |
| 59-181622 | 10/1984 | Japan . |
| 60-261377 | 12/1985 | Japan . |
| 63-194345 | 4/1988 | Japan . |
| 4-186653 | 7/1992 | Japan . |
| 7-18438 | 1/1995 | Japan . |
| 92/20093 | 11/1992 | WIPO ..................................... 361/234 |

OTHER PUBLICATIONS

Cooper, M. et al., "Thermal Contact Conductance", *Int. J. Heat Mass Transfer* 12:279–300 (1969).

Hasper, A. et al., "Heat transport in cold–wall single–wafer low pressure chemical–vapor–deposition reactors", *J. Vac. Sci. Technol. A* 10:3193–3202 (1992).

Wright, D. et al., "Low temperature etch chuck: Modeling and experimental results of heat transfer and wafer temperature", *J. Vac. Sci. Technol. A* 10:1065–1070 (1992).

*Primary Examiner*—R. Bruce Breneman
*Assistant Examiner*—Jeffrie R. Lund
*Attorney, Agent, or Firm*—Skjerven, Morrill, MacPherson, Franklin & Friel LLP; David E. Steuber; Serge J. Hodgson

[57] ABSTRACT

A wafer cooling device (WCD) for cooling a substrate, such as a wafer, during processing is presented. The substrate is mounted to an WCD heat transfer surface, thereby forming a cavity in between the substrate and the heat transfer surface into which gas is incorporated. An array of protuberances within the cavity provide support for the wafer. Contact heat conduction between the substrate and WCD is reduced by reducing the amount of direct contact between the substrate and WCD. Thus the heat transfer coefficient from the substrate, and hence substrate temperature, is controlled by adjusting the gas pressure in the cavity. In alternative embodiments, gas distribution channels are formed in the WCD heat transfer surface to increase gas pressure uniformity between the wafer and the WCD thus improving temperature uniformity across the substrate.

68 Claims, 19 Drawing Sheets

U.S. PATENT DOCUMENTS

| | | | |
|---|---|---|---|
| 5,517,753 | 5/1996 | Messina | 29/841 |
| 5,528,451 | 6/1996 | Su | 361/234 |
| 5,530,616 | 6/1996 | Kitabayashi et al. | 361/234 |
| 5,531,835 | 7/1996 | Fodor et al. | 118/728 |
| 5,539,179 | 7/1996 | Nozawa et al. | 219/121.43 |
| 5,542,559 | 8/1996 | Kawakami et al. | 216/67 |
| 5,572,398 | 11/1996 | Federlin et al. | 361/234 |
| 5,581,874 | 12/1996 | Aoki et al. | 29/825 |
| 5,583,736 | 12/1996 | Anderson et al. | 361/234 |
| 5,665,166 | 9/1997 | Deguchi et al. | 118/723 E |
| 5,675,471 | 10/1997 | Kotecki | 361/234 |

WAFER COOLING DEVICE

CROSS REFERENCE TO RELATED APPLICATION

This application is related to application Ser. No. 07971,363, filed Nov. 4, 1992, now U.S. Pat. No. 5,346,578, issued Sep. 13, 1994, and to application Ser. No. 08/602,641 filed contemporaneously herewith, each of which is incorporated herein by reference in its entirety.

FIELD OF THE INVENTION

This invention relates to a device for removing heat from a substrate, such as a wafer, during processing.

BACKGROUND OF THE INVENTION

To optimize plasma processes, high power-low pressure RF and/or microwave plasmas are increasingly being used. A large part of the RF power is delivered to the substrate, typically a silicon wafer, which heats the substrate. At low pressures, typically around 5 millitorr (mT), the dominant heat transfer mechanism for cooling the wafer is radiation, which is very inefficient. Consequently, the wafer becomes very hot, with wafer temperatures often exceeding 450° C. However, in many processes it is desirable to maintain the wafer at a lower temperature, e.g. 400° C. or below.

Lamont, Jr., U.S. Pat. No. 4,743,570 (herein incorporated by reference) discloses a method of thermal treatment of a wafer in an evacuated environment. The wafer is clamped in place and cooled by introducing a gas at a pressure of approximately 100 to 1000 microns in a region between the wafer and a heat sink. Although the method is well suited for low power application, typically 150 watts or less, at higher input power levels excessive wafer heating results. Also, the difference in pressure between the gas used for heat transfer, and the vacuum chamber causes mechanical deflection in the wafer, which is undesirable.

Recently, electrostatic chucks (hereinafter ESCs) have received much attention as the temperature control device in plasma processing. In ESCs, a wafer is held in place by electrostatic force, as illustrated in FIG. 1. Wafer 6 is separated from an electrode 2 by an insulting layer 4. A voltage (positive voltage in FIG. 1) is applied to electrode 2 by a voltage source 14. The voltage applied to the electrode produces an electrostatic charge (shown as −) on the contact surface 10 of insulating layer 4, which produces an equal and opposite electrostatic charge (shown as +) on contact surface 12 of wafer 6. The electrostatic charges on contact surfaces 10 and 12 produce an electrostatic force between contact surfaces 10 and 12. This electrostatic force holds wafer 6 against insulating layer 4. Heat delivered to wafer 6 is then transferred by contact heat conduction to insulating layer 4 which is cooled, typically with cooling water.

The ESC shown in FIG. 1 is a monopolar ESC in which electrical contact is made with wafer 6. In bipolar ESCs, as described in U.S. Pat. No. 4,184,188 to Briglia, two interdigitated oppositely polarized electrodes are used to create the electrostatic force which holds wafer 6, and the electrical contact with water 6 is eliminated.

ESCs are advantageous over conventional wafer holders (which mechanically clamp the wafer) because of the relatively uniform contact between the surface of the ESC and the backside of the wafer. This relatively uniform contact produces a relatively uniform temperature profile across the wafer, where the wafer temperature is a function of the input power. However, it is desirable to have the capability to readily adjust the wafer temperature during processing to meet various process criteria established by manufacturers.

SUMMARY OF THE INVENTION

According to the present invention, an wafer cooling device (WCD) is used to remove heat from a substrate, typically a wafer, during processing. In this manner, the heat transfer coefficient, and hence the substrate temperature, can be controlled.

The WCD includes a heat transfer surface to which a wafer is mounted. The wafer is mounted to the WCD using electrostatic force by methods well known to those skilled in the art. Alternatively, the wafer can be mounted mechanically, for example by clamping using a clamping ring.

A gas, such as hydrogen, helium, argon or nitrogen, is introduced into a cavity formed between the WCD heat transfer surface and the wafer.

The WCD further includes a ceramic disk connected to a metallic support disk which is connected to a metallic cooling disk. The wafer is mounted to the exposed surface of the ceramic disk, which is the WCD heat transfer surface. The metallic cooling disk is cooled through contact with water. Thermal conductivity in the area of contact between the ceramic disk and the metallic support disk is enhanced using thermally conductive paste. Similarly, thermal conductivity in the area of contact between the metallic support disk and the metallic cooling disk is enhanced using thermally conductive paste. In an alternative embodiment, the metallic cooling disk is brazed or soldered directly to the ceramic disk and the ceramic/cooling disk assembly is bolted into a cavity formed in the metallic support disk.

To reduce the area of contact between the WCD heat transfer surface and the wafer, a portion of the WCD heat transfer surface is recessed. The remaining WCD contact surface is roughened. This reduces heat conduction through direct contact between the wafer and the WCD. Thus the dominant heat transfer mechanism is through the gas between the wafer and the WCD wherein the gas pressure determines the heat transfer coefficient, hence wafer temperature. Gas distribution channels are formed in the WCD heat transfer surface to decrease gas pressure variations between the wafer and the WCD which result from gas leakage. Since the heat transfer coefficient, and wafer temperature, are mainly dependent on the gas pressure, providing a uniform gas pressure decreases temperature variations across the wafer.

In one embodiment, the gas distribution channels are arranged in a triangular pattern. In another embodiment, the gas distribution channels are arranged in a cross hatch pattern. In alternative embodiments, the gas distribution channels radiate outward in a spoke pattern from a central location on the WCD heat transfer surface. In another embodiment, eighteen gas distribution channels radiate outward from a hexagonal pattern of channels at the center of the WCD.

In all of the embodiments, one or more electrodes can be formed within the ceramic disk. A DC voltage is applied to the electrode(s) to produce electrostatic force which clamps the wafer to the WCD. In addition, RF power can be applied to the electrode(s) and also to the metallic support disk. For example, it may be desirable to apply RF power to accelerate ions towards a wafer mounted to the WCD, thus producing sputter etching of the wafer.

BRIEF DESCRIPTION OF THE DRAWINGS

FIG. 10b further illustrates the gas distribution channels for the WCD shown in FIG. 10a.

FIGS. 11a and 11b are expanded top and cross sectional views, respectively, of a region of the ceramic disk shown in FIG. 10a.

DESCRIPTION OF THE PREFERRED EMBODIMENTS

Figure 2:
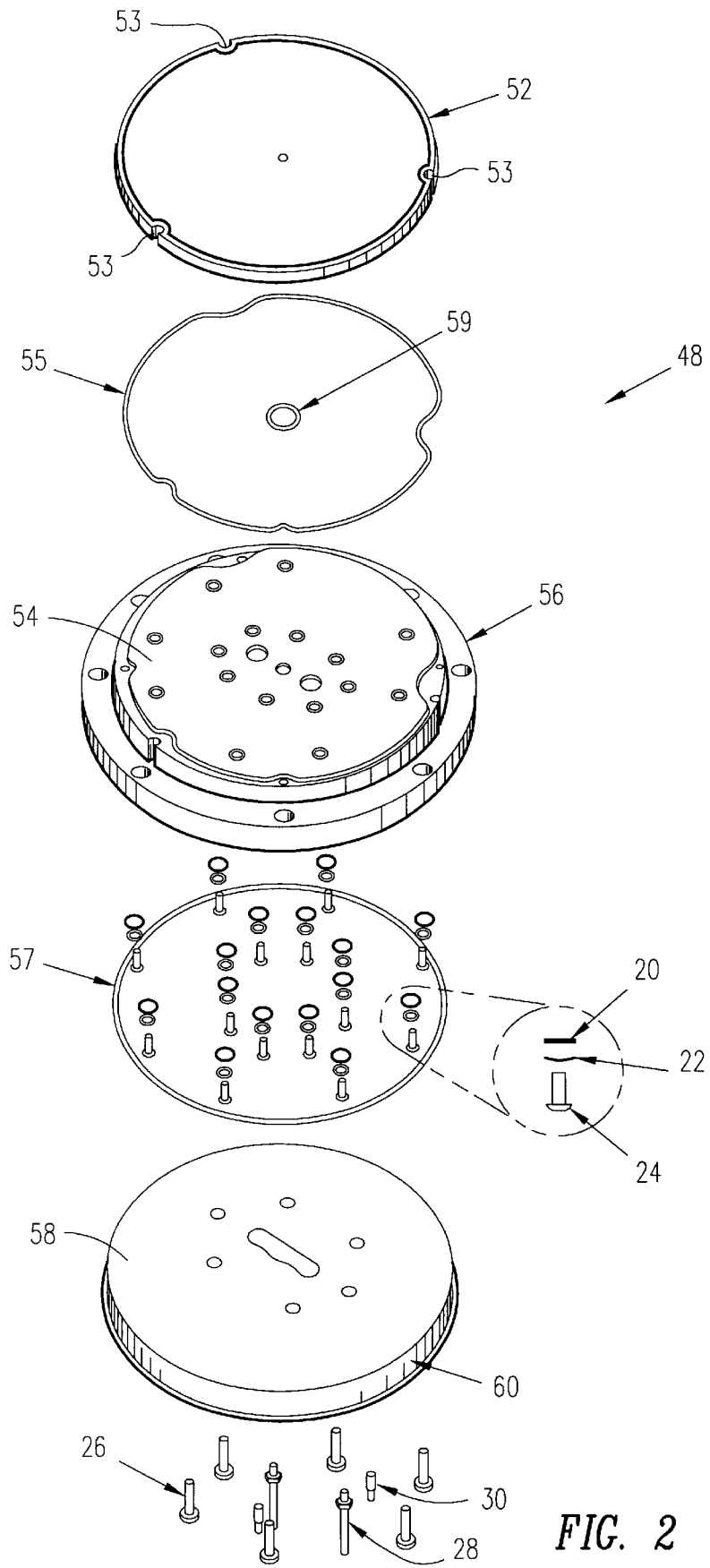
FIG. 2 is an exploded top isometric view of a wafer cooling device (WCD) in accordance with the present invention.

Shown in FIG. 2 is an exploded top isometric view of a wafer cooling device (hereinafter WCD) 48 in accordance with the present invention. WCD 48 includes a ceramic disk 52, a first layer 54 of a thermally conductive paste, a metallic support disk 56 formed of aluminum, a second layer 58 of a thermally conductive paste, and a metallic cooling disk 60 formed of brass. First layer 54 of thermally conductive paste enhances thermal conductivity between ceramic disk 52 and metallic support disk 56. Similarly, second layer 58 of thermally conductive paste enhances thermal conductivity between metallic support disk 56 and metallic cooling disk 60.

O-rings 55 and 59 are used to form a seal between ceramic disk 52 and metallic support disk 56, which isolate first layer 54 of thermally conductive paste from the vacuum process environment. An O-ring 57 is used to form a vacuum seal between metallic support disk 56 and a ceramic insulator 49 (shown in the cross sectional view of FIG. 4). First and second layers 54 and 58, respectively, of thermally conductive paste are manufactured by Omega Engineering, Inc. under the product name "OMEGATHERM 201", although any similar thermally conductive paste can be used.

Approximate widths of layers 52, 54, 56, 58, and 60 are 6.70, 0.13, 6.35, 0.13, and 3.18 millimeters (mm) respectively.

Ceramic disk 52 is made of approximately 90% aluminum oxide or aluminum nitride, and is manufactured by Toto, NGK, Fujitsu and Kyocera using tape casting methods. Using screen printing, electrode(s) are formed within ceramic disk 52. DC voltage is applied to the electrode(s) using two connector pins 28 to create electrostatic force which clamps a wafer to the WCD. Ceramic disk 52 also has three indentations 53 which accommodate wafer lift pins. Techniques for manufacturing ceramic disk 52 and the electrode(s) formed within ceramic disk 52 are well known to those skilled in the art, as is the use of wafer lift pins.

Techniques of forming a patterned electrode of the kind described above are taught in U.S. Pat. No. 4,184,188 to Briglia, which is incorporated herein by reference in its entirety.

Optionally, RF power can also be applied to the electrode(s) within ceramic disk 52, and to metallic support disk 56. For example, it may be desirable to apply RF power to accelerate ions towards a wafer mounted to the WCD, thus producing sputter etching of the wafer. RF power can be applied to the electrode(s) within ceramic disk 52 using connector pins 28. As shown, two connector pins 30 are provided for applying RF power to metallic support disk 56.

Ceramic disk 52 is bolted to metallic support disk 56 using sixteen bolts 24 which go through metallic support disk 56 and which are threaded into metallic threaded inserts (not shown) which are brazed to the bottom surface of ceramic disk 52. With each bolt 24, a washer 20, and a Belleville spring washer 22 is used. Belleville spring washers 22 act as springs to compensate for any expansion or contraction which occurs. Metallic cooling disk 60 is bolted into a cavity formed in metallic support disk 56 using six bolts 26 which go through metallic cooling disk 60 and which are threaded into metallic support disk 56.

Figure 1:
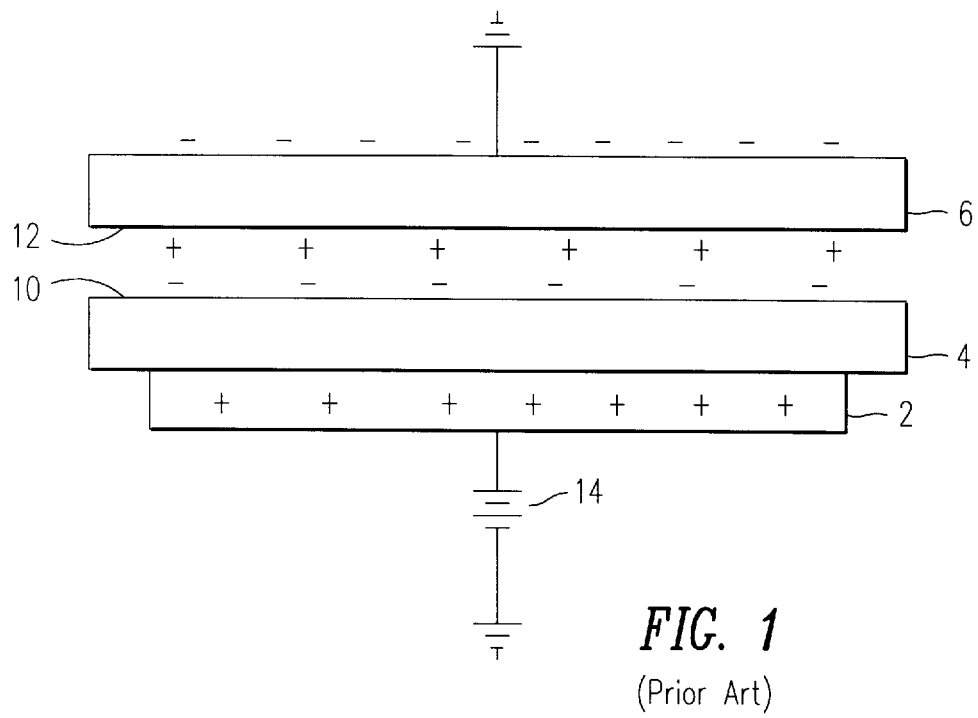
FIG. 1 illustrates a prior art electrostatic chuck.
Figure 3:
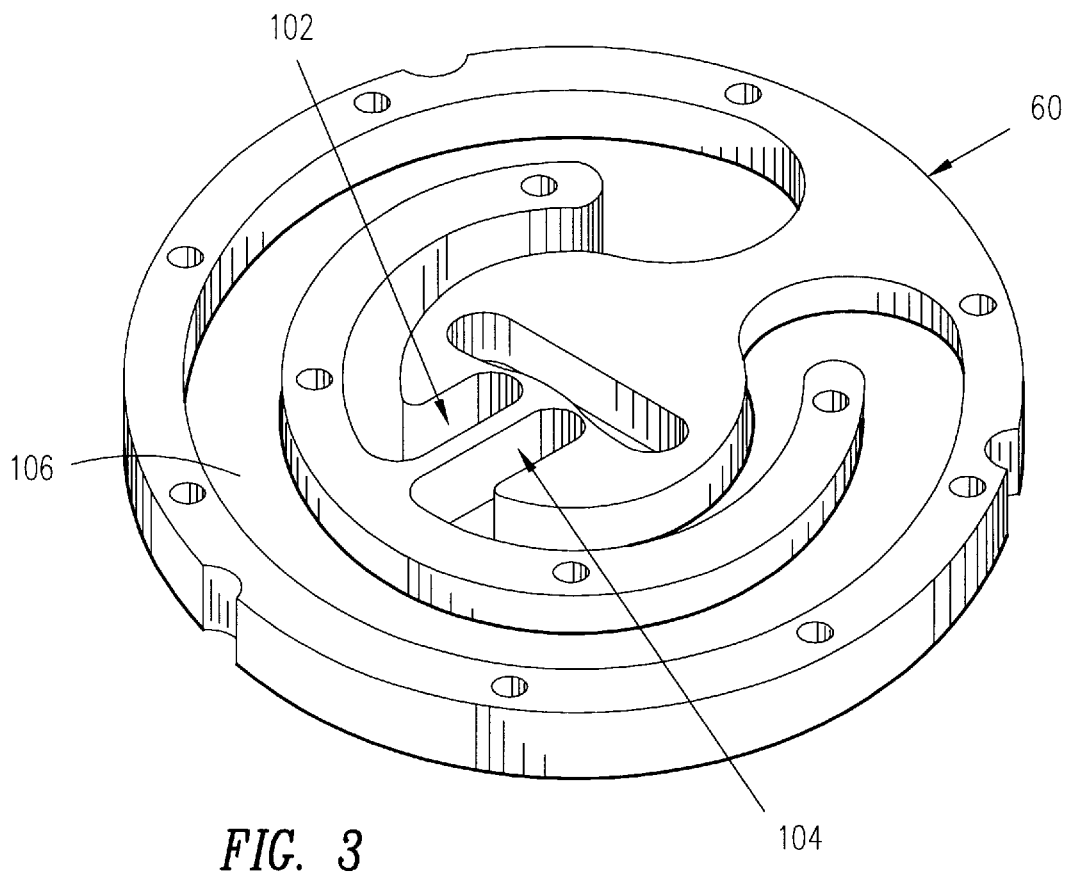
FIG. 3 is a top isometric view of a metallic cooling disk in accordance with the present invention.

A top isometric view of metallic cooling disk 60 is shown in FIG. 3. As shown, metallic cooling disk 60 has a cooling water channel 106 with a channel inlet 102 and a channel outlet 104. During use, cooling water enters through channel inlet 102, flows through cooling water channel 106 and exits through channel outlet 104.

Figure 4:
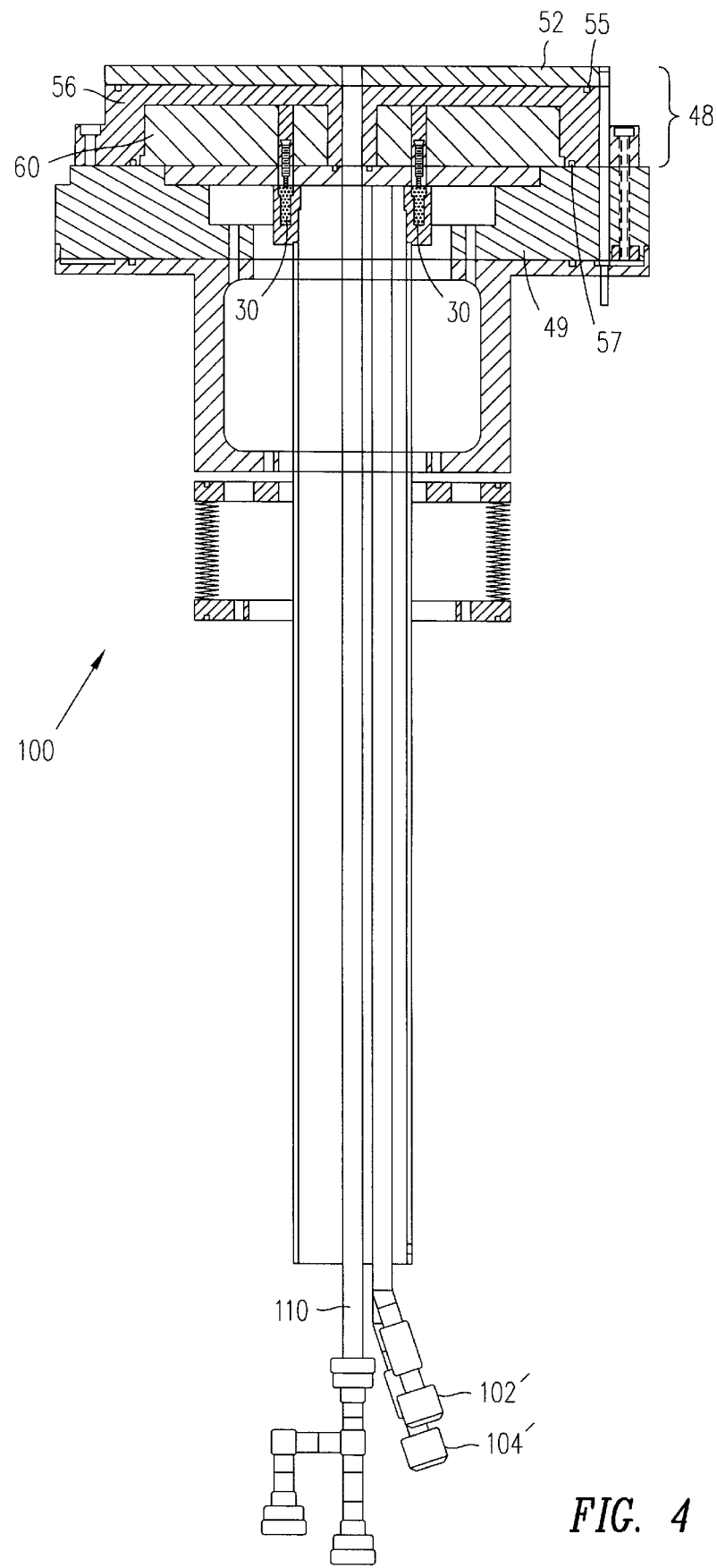
FIG. 4 is a cross sectional view of a unit into which the WCD in accordance with the present invention is installed.

FIG. 4 shows a cross sectional view of a unit 100 into which WCD 48 is installed. As shown, cooling water is fed to channel inlet 102 through a first cooling water tube 102' and is removed from channel outlet 104 by a second cooling tube 104', by methods well known to those skilled in the art. Also shown is a gas inlet tube 110. Ceramic disk 52 and metallic support disk 56 have holes near their centers which allow gas inlet tube 110 to pass through. It should be understood that ceramic disk 52, 0-ring 55, metallic support disk 56, 0-ring 57, metallic cooling disk 60, and connector pins 30 are the same as in FIG. 2.

Figure 5:
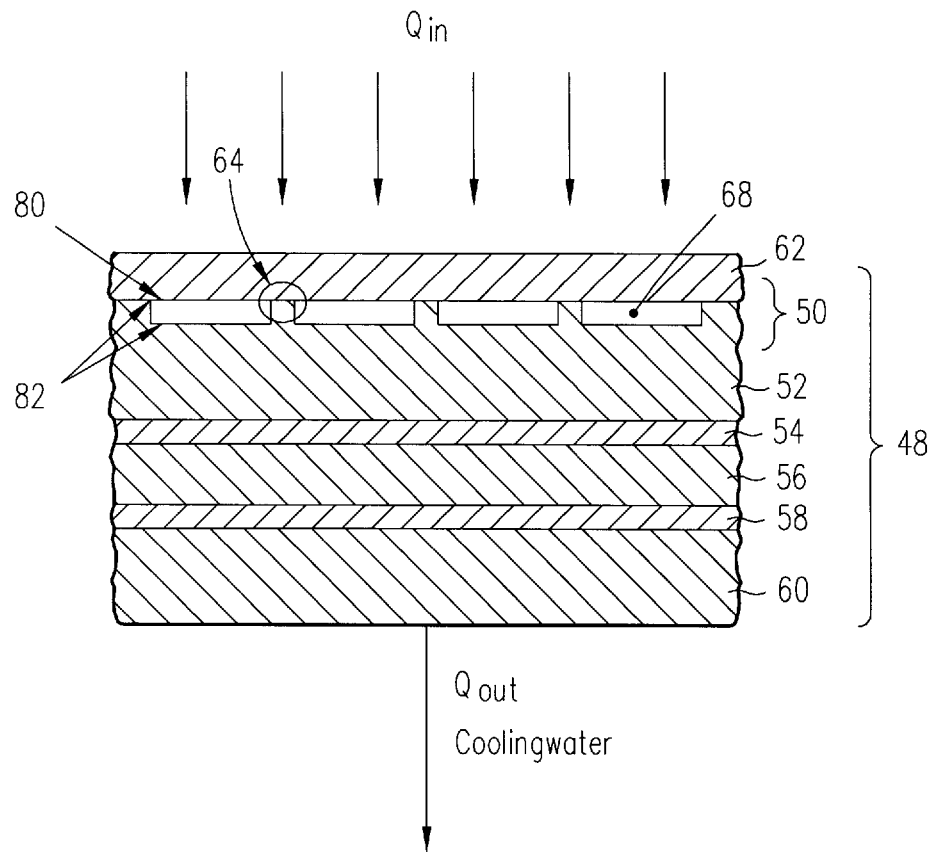
FIG. 5 is a cross sectional view of a WCD in accordance with the present invention.

FIG. 5 is a cross sectional view of a portion of WCD 48. A substrate, wafer 62, is mounted to ceramic disk 52 creating a wafer-WCD interface 50. For example, wafer 62 can be made of silicon, gallium arsenate or ceramic. The wafer is mounted to the WCD using electrostatic force by methods well known to those skilled in the art. Alternatively, the wafer can be mounted mechanically, for example by clamping using a clamping ring. As shown, a portion of the contact surface 82 of WCD 48 is recessed. The contact surface 80 of wafer 62 thus only contacts WCD 48 along the raised surfaces of contact surface 82. Thus a wafer-WCD gap 68 exists at wafer-WCD interface 50. Gap 68 can be filled with a gas, such as helium, hydrogen, argon or nitrogen.

Figure 6:
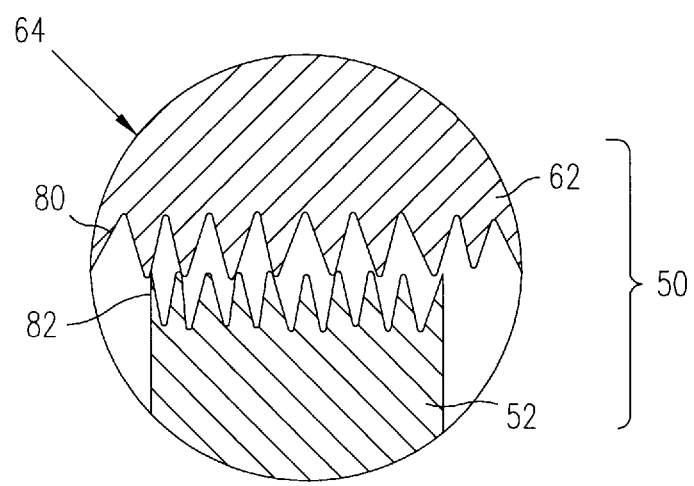
FIG. 6 shows a blown up cross sectional view of a portion of the wafer-WCD interface shown in FIG. 5.

FIG. 6 shows a blown up cross sectional view (64 in FIG. 5) of one of the raised surfaces at wafer-WCD interface 50. As shown in FIG. 6, at wafer-WCD interface 50, only microscopic points of contact (exaggerated in illustration) between wafer 62 and ceramic disk 52 exist since the contact surface 80 of wafer 62 and the contact surface 82 of ceramic disk 52 are not perfectly smooth.

WCD 48 is mounted in a vacuum chamber where processing of wafer 62 occurs. During processing of wafer 62, power input heats wafer 62. The power input may be derived from, for example, sputter etching of the wafer, and or plasma enhanced chemical vapor deposition (PECVD) on the wafer. This input heat is shown as $Q_{in}$ in FIG. 5. Input heat $Q_{in}$ moves along a heat transfer path from wafer 62, across wafer-WCD interface 50, through ceramic disk 52, across first thermally conductive paste layer 54, through metallic support disk 56, across second thermally conductive paste layer 58, and finally through metallic cooling disk 60. Heat (shown as $Q_{out}$) is removed from metallic cooling disk 60 by cooling water which contacts and cools metallic cooling disk 60, as discussed above in reference to FIG. 3.

Referring to FIG. 5, there are two primary pathways for heat transfer across wafer-WCD interface 50. The first is conduction through the gas in gap 68, hereinafter referred to as gas heat conduction. The second is conduction directly across the microscopic points of contact between contact surfaces 80, 82 at wafer-WCD interface 50, hereinafter referred to as contact heat conduction.

Figure 7:
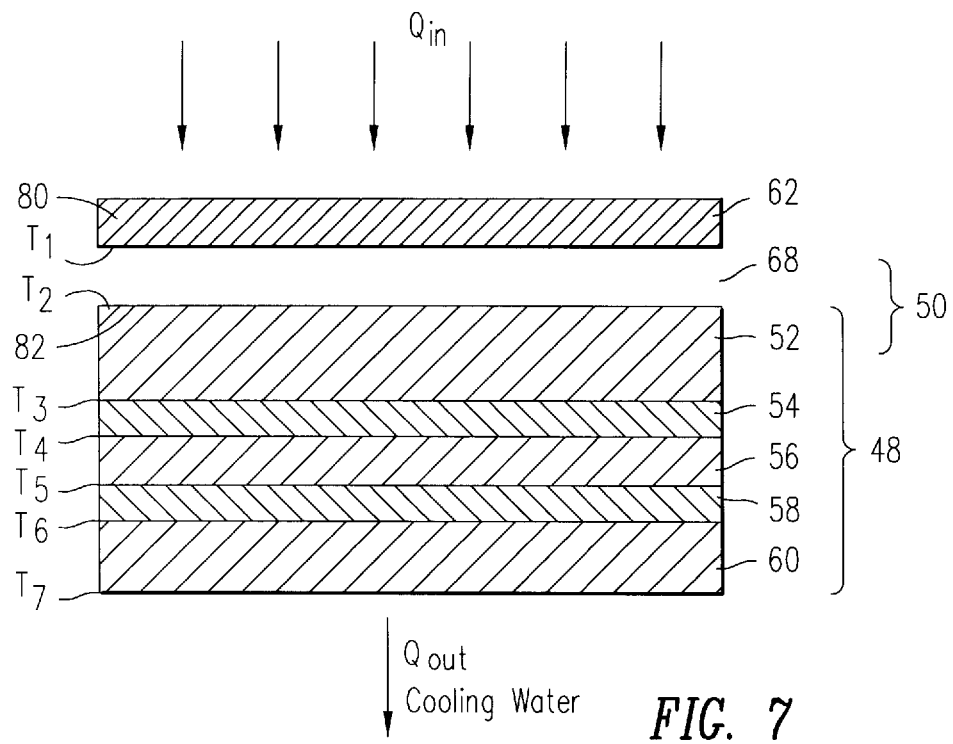
FIG. 7 shows a hypothetical wafer-WCD assembly in which there is no direct contact between the surfaces of the wafer and the WCD.

The two heat transfer pathways shall be discussed separately. First, gas heat conduction shall be discussed assuming that there is no contact heat conduction, i.e., that there is no direct contact between contact surfaces 80, 82. FIG. 7 shows a hypothetical wafer-WCD assembly in which there is no direct contact between contact surfaces 80, 82. Since there is no direct contact at wafer-WCD interface 50, there is no contact heat conduction. Thus all heat transfer across wafer-WCD interface 50 in FIG. 7 occurs across gap 68 through gas heat conduction.

The overall heat transfer coefficient $h_0$ for the wafer-WCD assembly illustrated in FIG. 7 can be calculated by first calculating the heat transfer coefficient across each layer in the heat transfer path. Calculated and measured heat transfer coefficients are given below in Table 1 where metallic support disk 56 is aluminum, metallic cooling disk 60 is brass, and gap 68 is filled with Helium at 10 Torr.

TABLE 1

| Step | Heat Transfer Medium | Heat Transfer Coefficient for Step ($W/M^2$ - K) |
|------|---------------------|--------------------------------------------------|
| 1 | Wafer-WCD Interface 50 (with He at 10 Torr) | $h_1 = 275$ |
| 2 | Ceramic Disk 52 (6.7 mm) | $h_2 = 2500$ |
| 3 | Thermal Paste 54 (0.13 mm) | $h_3 = 18110$ |
| 4 | Support Disk 56 (Aluminum at 6.35 mm) | $h_4 = 36220$ |
| 5 | Thermal Paste 58 (0.13 mm) | $h_5 = 18110$ |
| 6 | Cooling Disk (Brass at 3.18 mm) | $h_6 = 39370$ |
|   | Overall | $h_0 = 238$ |

The heat transfer coefficient for any particular layer (i) is set forth in the following equation:

$$Q_i = h_i * A_i * \Delta T_i \qquad (1)$$

where $Q_i$ is the heat conducted, $h_i$ is the heat transfer coefficient, $A_i$ is the area through which heat is conducted, and $\Delta T_i$ is the temperature difference over which the heat is conducted.

The overall heat transfer coefficient $h_0$ across all of the layers is the series sum of all of the layer heat transfer coefficients as set forth in the following equation:

$$h_0 = ((1/h_1)+(1/h_2)+(1/h_3)+(1/h_4)+(1/h_5)+(1/h_6))^{-1} \qquad (2)$$

The area $A_i$ through which heat is conducted is substantially the same for each step (i) along the heat transfer path. Also, at steady state where $Q_{in}$ equals $Q_{out}$, the heat conducted ($Q_i$) is the same for each step along the heat transfer path. Thus $h_i * \Delta T_i$ will be the same for each step (i) along the heat transfer path. Consequently, large temperature drops occur across layers having low heat transfer coefficients and small temperature drops occur across layers having large heat transfer coefficients.

Figure 8:
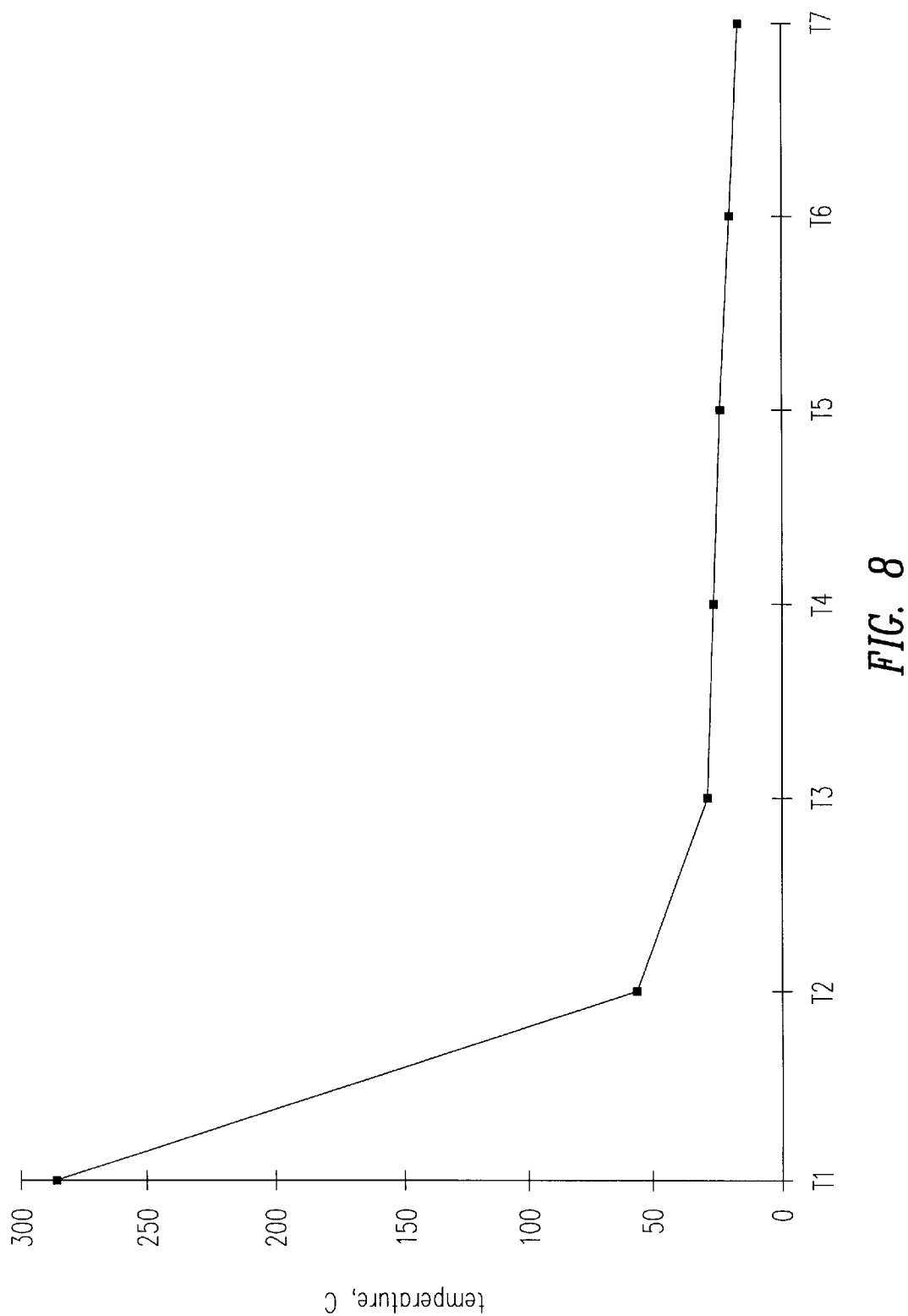
FIG. 8 is a graph which shows the temperature profile along the heat transfer path from the wafer through the WCD.

The temperature profile along the heat transfer path from wafer 62 to metallic cooling disk 60 is shown in FIG. 8 for an input heat $Q_{in}$ value of 2000 watts. As shown in FIG. 8, T1 is the temperature at contact surface 80 of wafer 62, T2 is the temperature at contact surface 82 of ceramic disk 52, T3 is the temperature at the bottom of ceramic disk 52, T4 is the temperature at the top of aluminum support disk 56, T5 is the temperature at the bottom of aluminum support disk 56, T6 is the temperature at the top of brass cooling disk 60, and T7 is the temperature at the bottom of brass cooling disk 60.

FIG. 8 shows that the temperature drops from approximately 285° C. to 55° C. across gap 68, for a temperature difference of approximately 230° C. The total temperature drop (T7–T1) is approximately 260° C. Thus approximately 88% of the temperature drop occurs across gap 68.

As shown in Table 1, the lowest heat transfer coefficient h along the heat transfer path is at wafer-WCD interface 50 with a value of 275 $W/M^2$-K. This relatively low heat transfer coefficient correlates to a relatively high temperature drop at wafer-WCD interface 50 between contact surfaces 80, 82, as shown by the temperature drop between T1 and T2 in FIG. 8. However, this temperature drop can be controlled by adjusting the heat transfer coefficient across wafer-WCD interface 50, and hence wafer temperature can be controlled. To illustrate, if the heat transfer coefficient is increased, then the temperature drop will decrease corresponding to a decrease in wafer temperature. Conversely, if the heat transfer coefficient is decreased, then the temperature drop will increase corresponding to an increase in wafer temperature.

The behavior of the gas heat transfer coefficient across wafer-WCD interface 50 falls into three operating regimes. The three operating regimes are: (1) the continuum regime; (2) the free-molecular regime; and (3) the transition regime. In the continuum regime, the heat transfer coefficient is a function of the width of gap 68 and the thermal conductivity of the gas but is independent of the gas pressure at the backside of wafer 62 in gap 68 (hereinafter referred to as backside gas pressure). In the free-molecular path regime, the heat transfer coefficient is a function of the backside gas pressure and the molecular weight of the gas but is independent of the width of gap 68. The transition regime is characterized by a smooth interpolation between the continuum regime and the free-molecular path regime.

If the gas composition does not vary, for example if only helium or hydrogen is used, then the thermal conductivity and molecular weight of the gas are constant. In this situation, the behavior of the heat transfer coefficient can be summarized as follows: in the continuum regime, the width of gap 68 controls the heat transfer coefficient, in the free-molecular path regime, the backside gas pressure controls the heat transfer coefficient, and in the transition regime both the width of gap 68 and the backside gas pressure control the heat transfer coefficient.

Figure 9:
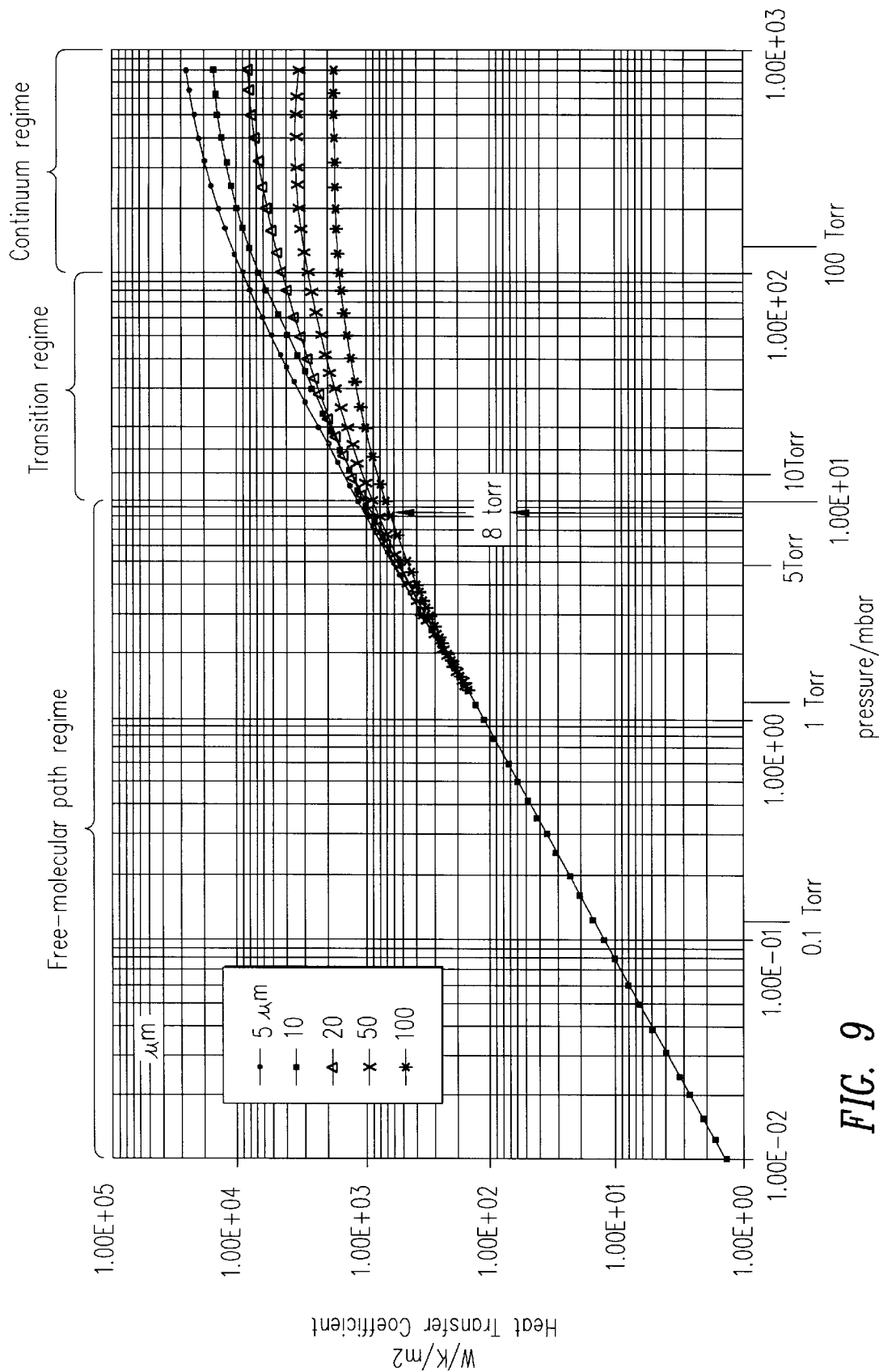
FIG. 9 is a graph which illustrates the behavior of the heat transfer coefficient in relation to gas pressure and contact surface spacing.

FIG. 9 is a graph which illustrates the behavior of the heat transfer coefficient versus backside gas pressure for hydrogen at gap 68 widths of 5, 10, 20, 50, and 100 μm. The free-molecular path regime, in which the heat transfer coefficient is a function of backside gas pressure only, is seen for gas pressures in the range of 0 to approximately 13 millibar (0 to 10 Torr). The continuum regime, in which the heat transfer coefficient is a function of the width of gap 68 only, is seen for backside gas pressures greater than approximately 100 millibar (78 Torr). In between these two regimes, for gas pressures in the range of approximately 13 to 100 millibar (10 to 78 Torr), the transition regime is seen.

To summarize, as shown in FIG. 9, the gas heat transfer coefficient should be controlled by adjusting the backside gas pressure, independent of gap spacing, within the range of 0 to 78 Torr. In actuality, wafer temperature measurements have determined that the gas heat transfer coefficient is controlled by adjusting backside gas pressure within the range of approximately 0 to 20 Torr. By controlling the heat transfer coefficient, the temperature drop from wafer 62 to ceramic disk 52 can be controlled. The temperature drop from wafer 62 to ceramic disk 52 in turn controls the temperature of wafer 62. Thus, for backside gas pressures within the range of approximately 0 to 20 Torr, the temperature of wafer 62 can be readily controlled by simply adjusting the backside gas pressure.

Figure 23:
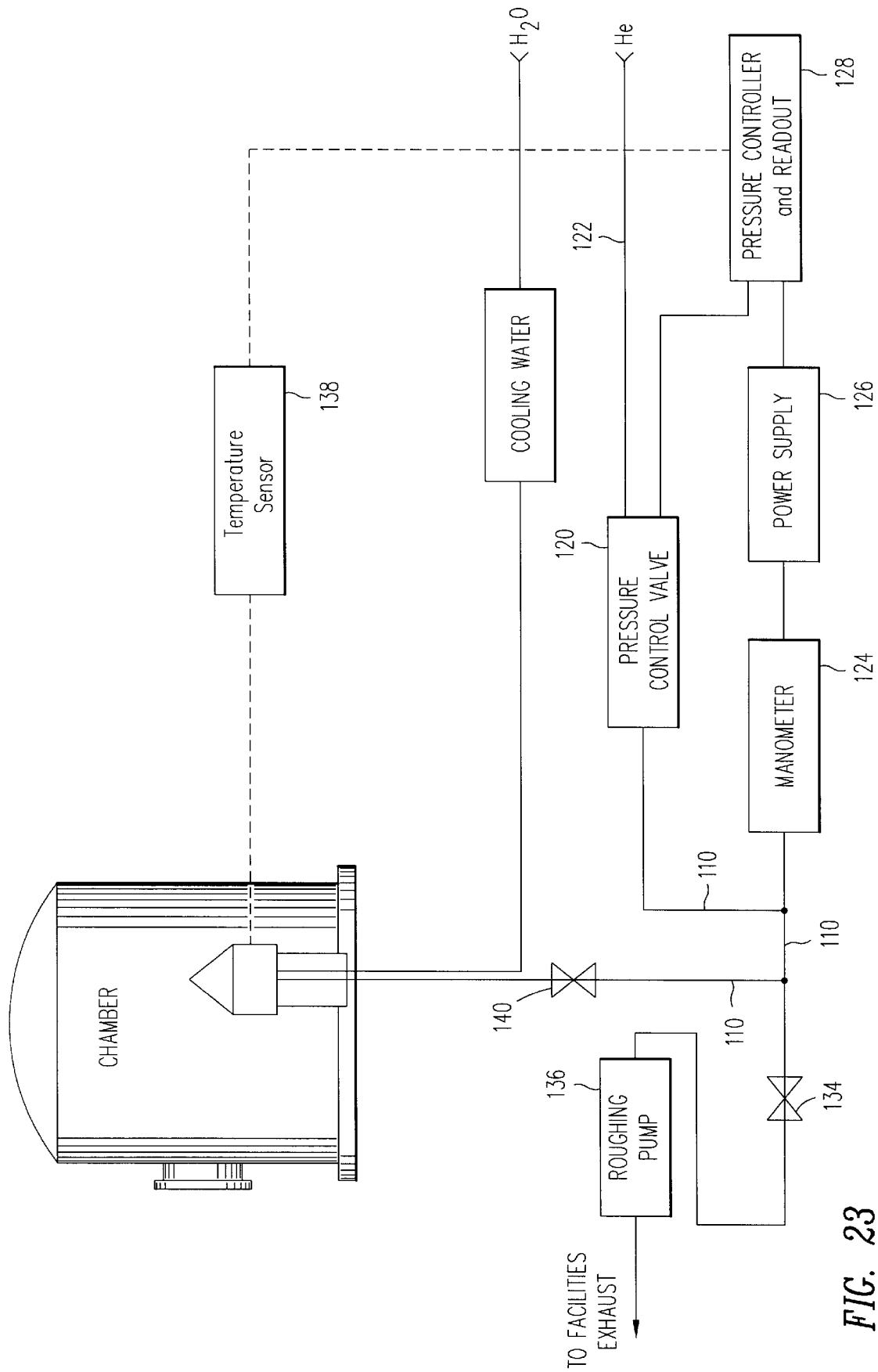
FIG. 23 is a block diagram which illustrates means for controlling backside gas pressure of a WCD in accordance with the present invention.

FIG. 23 is a block diagram which illustrates one means for controlling the backside gas pressure. Gas inlet tube 110, which is the same as gas inlet tube 110 shown in FIG. 4, has an inner diameter which is sufficient to prevent any appreciable pressure drop within the gas inlet tube 110 at the gas flow rates associated with the WCD. Thus, the gas pressure in gas inlet tube 110 is substantially equal to the backside gas pressure at the gas inlet port. A valve 140 is coupled to gas inlet tube 110. Valve 140 shuts off gas flow to the WCD, for example, during wafer change.

A manometer 124 is mechanically connected to gas inlet tube 110, and measures the pressure in gas inlet tube 110. Manometer 124 outputs a signal representing the measured pressure to pressure controller and readout 128 (hereinafter referred to as controller 128). Controller 128 is electrically connected to pressure control valve 120, and controls pressure control valve 120 in response to the pressure measured by manometer 124. Control valve 120 is mechanically connected to a gas line 122 which is connected to a source of gas, such as helium.

Controller 128 is set with the desired pressure value (the set point pressure), for example 10 Torr. During use, if the pressure measured in gas inlet tube 110 by manometer 124 falls below the set point pressure, for example falls below 10 Torr, then controller 128 instructs pressure control valve 120 to increase the flow rate of helium. This raises the pressure in gas inlet tube 110 until the set point pressure is reached. Conversely, if the pressure measured in gas inlet tube 110 by manometer 124 climbs above the set point pressure, then controller 128 instructs pressure control valve 120 to decrease the flow rate of helium. This reduces the pressure in gas inlet tube 110 until the set point pressure is reached.

A power supply 126, electrically connected between manometer 124 and controller 128, provides the voltage required to operate manometer 124, controller 128, and pressure control valve 120.

Pressure control valve 120 is manufactured by Unit Instruments, model #C11-55719, although any similar control valve can be used. Controller 128 is also manufactured by Unit Instruments, model #URS-20P, although any similar controller can be used. Manometer 124 is manufactured by Tylan General, model #CMLA-21506, although any similar manometer can be used.

A valve 134, such as a needle valve, allows a fixed amount of gas to flow to pump 136. This insures a steady state condition for pressure control valve 120. Valve 134 is set such that the gas flow rate through pressure control valve 120 is at or near the gas flow rate which is optimal for pressure control valve 120, thus improving tolerances in gas flow rate control, hence improving tolerances in backside pressure control.

To determine what pressure value (the set point) should be set into controller 128 to achieve a certain wafer temperature, a lookup table is used. For any given process, the lookup table is a correlation of measured wafer temperature in relation to set point pressure. To generate the lookup table, the set point pressure is set to a first value and the wafer temperature is measured. The set point pressure is then set to second value and the wafer temperature is again measured. This iterative process continues and a lookup table is completed.

Alternatively, the wafer temperature is measured directly, and the measured temperature is used to control gas pressure. The wafer temperature can be measured using infrared techniques, or by using embedded or contact thermocouples well known to those skilled in the art. The wafer temperature is detected by a temperature sensor 138 (FIG. 23). Temperature sensor 138 delivers a signal representing the wafer temperature to controller 128 which in turn instructs pressure control valve 120 which adjusts the backside gas pressure and maintains the desired wafer temperature. To illustrate, if the wafer temperature is greater than the desired wafer temperature, controller 128 increases the backside gas pressure by instructing pressure control valve 120 to let more gas into the backside feed line. This decreases the wafer temperature to the desired valve. Conversely, if the wafer temperature falls below a desired wafer temperature, controller 128 decreases the backside gas pressure by instructing pressure control valve 120 to reduce the amount of gas into the backside feed line. This increases the wafer temperature to the desired value.

As described above, in the hypothetical arrangement shown in FIG. 7, it was assumed that there is no contact heat conduction at wafer-WCD interface 50. However, under certain conditions contact heat conduction can be substantial. Referring back to FIGS. 5 and 6, the amount of heat transferred by contact heat conduction is determined by the size of the area of direct contact between contact surfaces 80, 82. The greater the area of direct contact, the greater the heat transferred by contact heat conduction. The size of the area of direct contact is a function of the roughness, flatness and hardness of contact surfaces 80, 82, as well as the applied pressure between contact surfaces 80, 82. Since the characteristics of contact surface 80 vary from wafer to wafer, and since the characteristics of contact surface 82 can change over time, accurately controlling contact heat conductance is difficult.

Figure 10A:
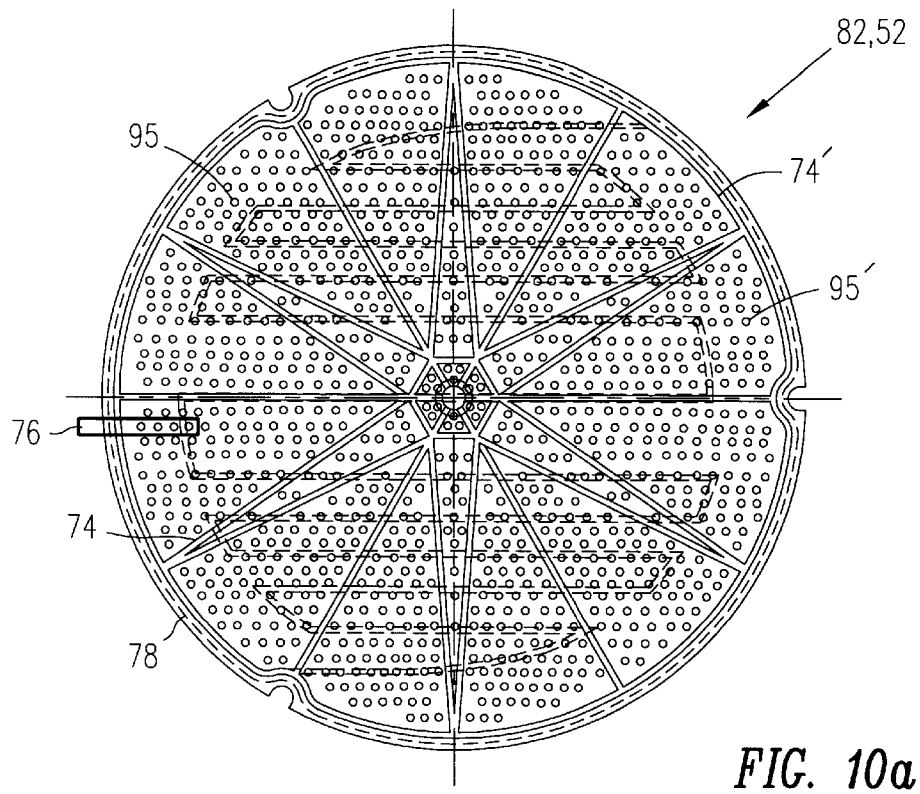
FIG. 10a shows a top view of the contact surface of the ceramic disk for a WCD in accordance with the present invention.
Figure 11A:
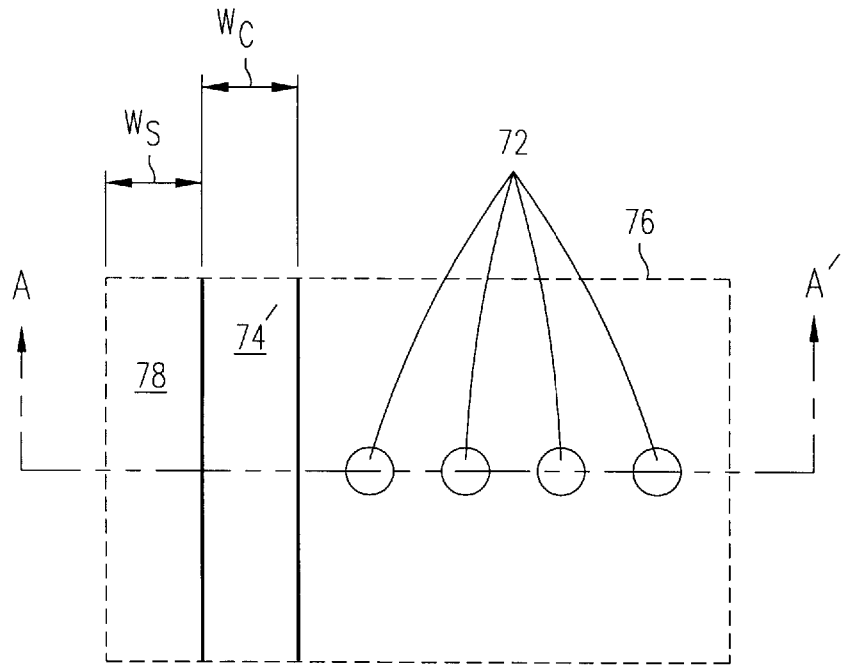
Figure 11B:
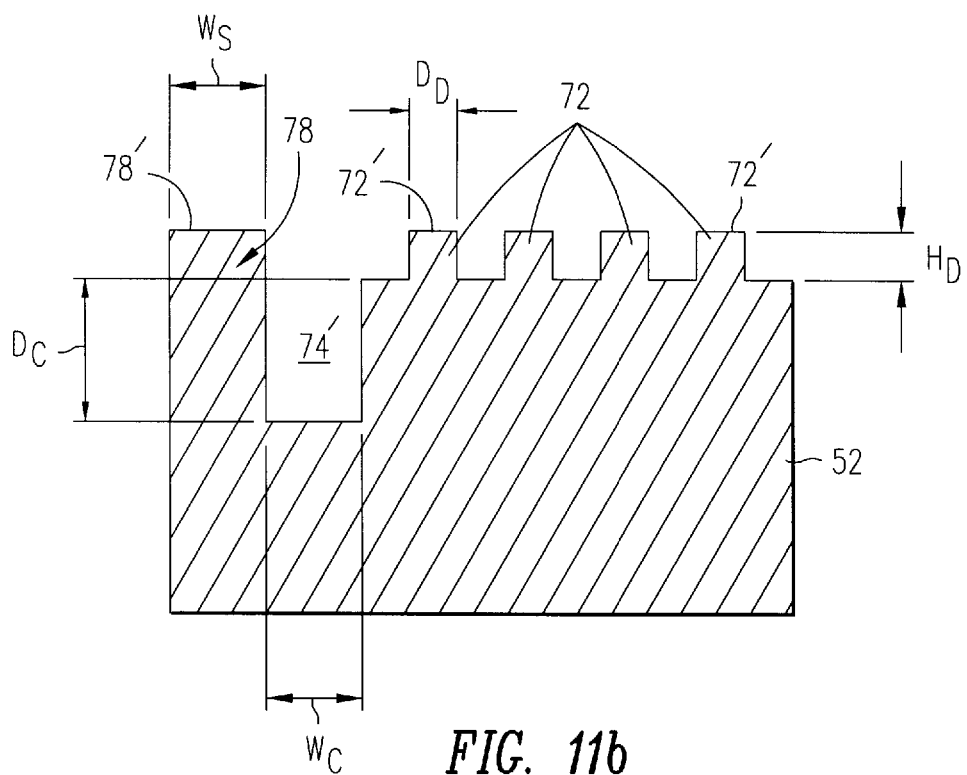

Two techniques are used to reduce the area of direct contact between contact surfaces 80, 82. First, a large percentage of the surface area available for contact is removed. FIG. 10a shows a top view of contact surface 82 of ceramic disk 52 for a preferred embodiment in accordance with the present invention. FIG. 11a shows an expanded top view of region 76 in FIG. 10a. FIG. 11b shows a cross sectional view of region 76 along the line A - A' shown in FIG. 11a. As seen in FIG. 10a, contact surface 82 has a dot pattern.

Top and cross sectional views of four dots 72 are shown in FIG. 11a and 11b, respectively. As seen in FIG. 11b, each dot 72 represents a raised surface area 72' of contact surface 82, with each dot having a diameter $D_D$ typically within a range of approximately 1.5 mm to 2.5 mm. Hence, a wafer (not shown) mounted to ceramic disk 52 will only contact ceramic disk 52 along the surfaces 72' of the raised dots 72. Thus a large percentage of the surface area of contact surface 82 available for contact heat conduction is removed. It is desirable to remove between approximately 80 to 98 percent of the surface area of contact surface 82 available for contact heat conduction. In the embodiment shown in FIG. 10a, approximately 80 percent of the total surface area of contact surface 82 is recessed with only approximately 10 percent of the total surface area remaining for contact heat conduction. Although in the top views shown in FIGS. 10a and 11a dots 72 are circular, it should be understood that dots 72 can be in any shape, for example triangular or rectangular.

A second technique to reduce the amount of direct contact between contact surfaces 80, 82 is to roughen contact surface 82 of ceramic disk 52. By roughening contact surface 82, the number of microscopic points of contact between contact surfaces 80, 82 are reduced. This reduces the amount of direct contact between contact surfaces 80, 82, and hence contact heat conduction.

Figure 12:
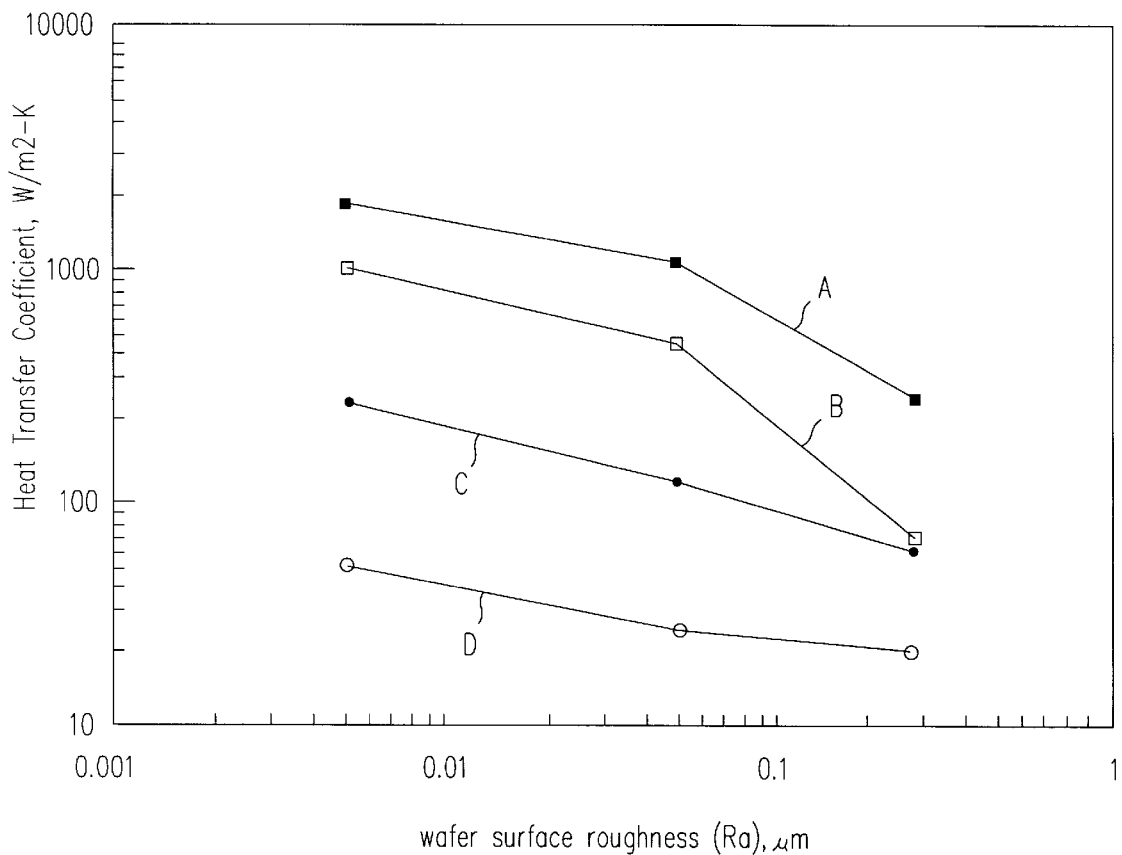
FIG. 12 is a graph which shows the relation between the heat transfer coefficient and wafer surface roughness for various WCDs in accordance with the present invention.

FIG. 12 is a graph which shows the behavior of the heat transfer coefficient for contact heat transfer versus wafer surface roughness (roughness of contact surface 80 of wafer 62) for various WCDS. The WCDs in curves A, B and C, D have contact surfaces (82) with roughnesses of 0.05 and 0.35 $\mu$m Ra, respectively, where $\mu$m Ra is the average deviation in microns from a hypothetical mean plane generally parallel to the contact surface. Furthermore, the contact surfaces (82) in the WCDs in curves B and D are similar to the contact surface 82 shown in FIG. 10a and have 90% of the total surface area of contact surface 82 recessed.

As shown by the curve labeled A in FIG. 12, contact heat conductance can become quite efficient with a heat transfer coefficient of approximately 2000 W/M²-K if contact surfaces 80, 82 are polished to less than 0.05 $\mu$m Ra. In contrast, as shown in Table 1, the heat transfer coefficient for helium gas at 10 Torr in gap 68 has a maximum value of approximately 275 W/M²-K. Since the contact and gas heat conductances act as parallel conductances, which are added to get the total conductance, the total conductance is dominated by contact heat conductance. Thus the wafer temperature is determined primarily by the power input, and is substantially independent of the backside gas pressure.

As shown in the curve labeled D in FIG. 12, the heat transfer coefficient for contact heat conduction is substantially reduced by removing a large percentage (90%) of the surface area available for contact, and roughening the surface area left available for contact. In these circumstances, heat transfer coefficients for contact heat conduction ranging from approximately 20 to 50 W/M²-K are obtained depending upon the wafer surface roughness. With the heat transfer coefficient for contact heat conduction below approximately 50 W/M²-K, contact heat conduction becomes unimportant and the bulk of the heat produced in the wafer is removed through the gas layer. Under these ideal circumstances, the wafer temperature is controlled by adjusting backside gas pressure.

In curve B in FIG. 12, heat transfer coefficients ranging from approximately 60–1000 W/M²-K, depending upon wafer surface roughness, are obtained even with 90 percent of the surface area available for contact heat conduction removed. In curve C, heat transfer coefficients ranging from approximately 50 to 275 W/M²-K, depending upon wafer surface roughness, are obtained even with a roughened contact surface 82. Curves B and C illustrate that significant contact heat conduction occurs unless both a large percentage of the surface area available for contact is removed and the remaining contact surface is roughened. As those skilled in the art should understand, the percentage of surface 82 recessed, and the surface roughness of the remaining contact surface is a design choice which is based on factors such as expected wafer smoothness, wafer size and expected heat input.

Generally it is desirable to have the WCD contact surface roughened to a roughness greater than the wafer surface roughness and less than or equal to 3.0 $\mu$m Ra. Furthermore, $R_{max}$ should be less than or equal to 200% of Ra, where $R_{max}$ is the maximum deviation from a hypothetical mean plane generally parallel to the WCD contact surface. For example, if the roughness is 3.0 $\mu$m Ra, $R_{max}$ should not exceed 6.0 $\mu$m. Also, the WCD contact surface should be roughened such that the microscopic points of contact (see FIG. 6) are randomly distributed, for example by bead blasting the contact surface, and do not have a pattern.

Besides removing a large percentage of the surface area available for contact, the dot pattern shown in FIG. 10a allows the spacing between the wafer and electrode(s) encapsulated in ceramic disk 52 to be accurately controlled. By accurately controlling the electrode(s)/wafer spacing, a uniform electrostatic clamping force is produced. In addition, the dot pattern provides support for a wafer mounted to the WCD, and eliminates mechanical deflection of the mounted wafer.

The dot pattern also produces a uniform gap between wafer 62 and ceramic disk 52 into which gas can be introduced. As shown in FIG. 11b, the width of this gap is fixed by the height $H_D$ of dots 72. Within the pressure range of interest (0–20 Torr) it is desirable to keep the dot height $H_D$ below 40 $\mu$m, and preferably within the range of 20 to 35 $\mu$m, to prevent heat transfer performance from degrading. Tolerances in dot height $H_D$ should be within +10% of the value selected. The degradation of heat transfer performance is illustrated in FIG. 9 where, at 10 Torr (13 mbar), heat transfer coefficients of approximately 1700, 1300 and 900 W/M²-K are expected for WCDs having dot heights $H_D$ of 20, 50, and 100 μm, respectively.

Figure 13:
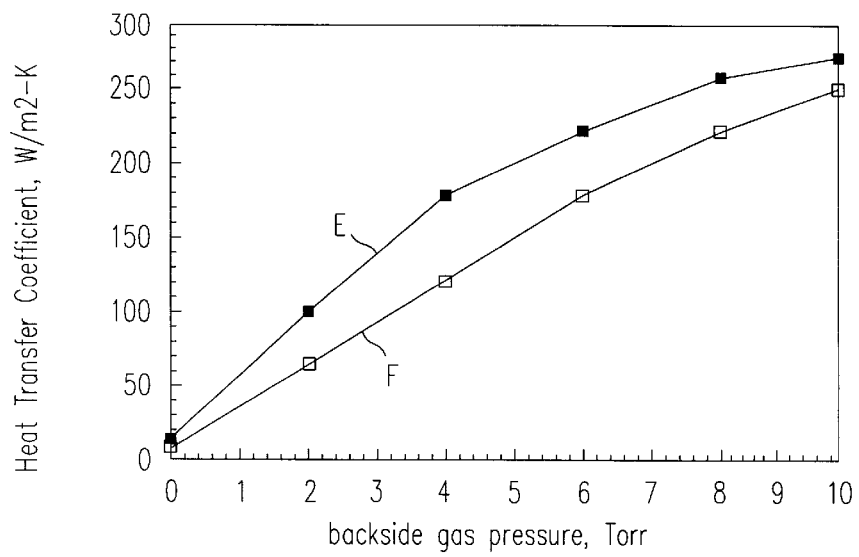
FIG. 13 is a graph which shows the overall heat transfer coefficient versus gas pressure measured at the center of a WCD in accordance with the present invention.

FIG. 13 is a graph which shows the overall heat transfer coefficient (gas and contact heat conduction) versus gas pressure, measured at the center of an embodiment of the present invention having a dot height $H_D$ equal to 20 μm. In curves E, F, hydrogen and helium are used as the gas, respectively. FIG. 13 illustrates that the heat transfer coefficient and hence wafer temperature can be readily adjusted by controlling the backside gas pressure.

Note that the overall heat transfer coefficient shown in FIG. 13 is substantially less than the heat transfer coefficient predicted in FIG. 9. This is most likely due to a factor known as the accommodation coefficient, which is the extent to which an average molecule fails to reach thermal equilibrium with the surface it contacts, i.e. the contact surfaces of wafer 62 and ceramic disk 52. The accommodation coefficient also possibly accounts for the non-linear response shown in FIG. 13 as compared to a more linear response predicted in FIG. 9.

It is desirable to maintain a uniform temperature across the surface of the wafer since variations in the wafer temperature adversely effect processing. The wafer temperature is controlled by the backside gas pressure in gap 62. Thus, to achieve a uniform wafer temperature, a uniform backside gas pressure must be maintained. Otherwise, relatively high wafer temperatures will exist in regions with low backside gas pressure and relatively low wafer temperatures will exist in regions with high backside gas pressure.

Figure 14:
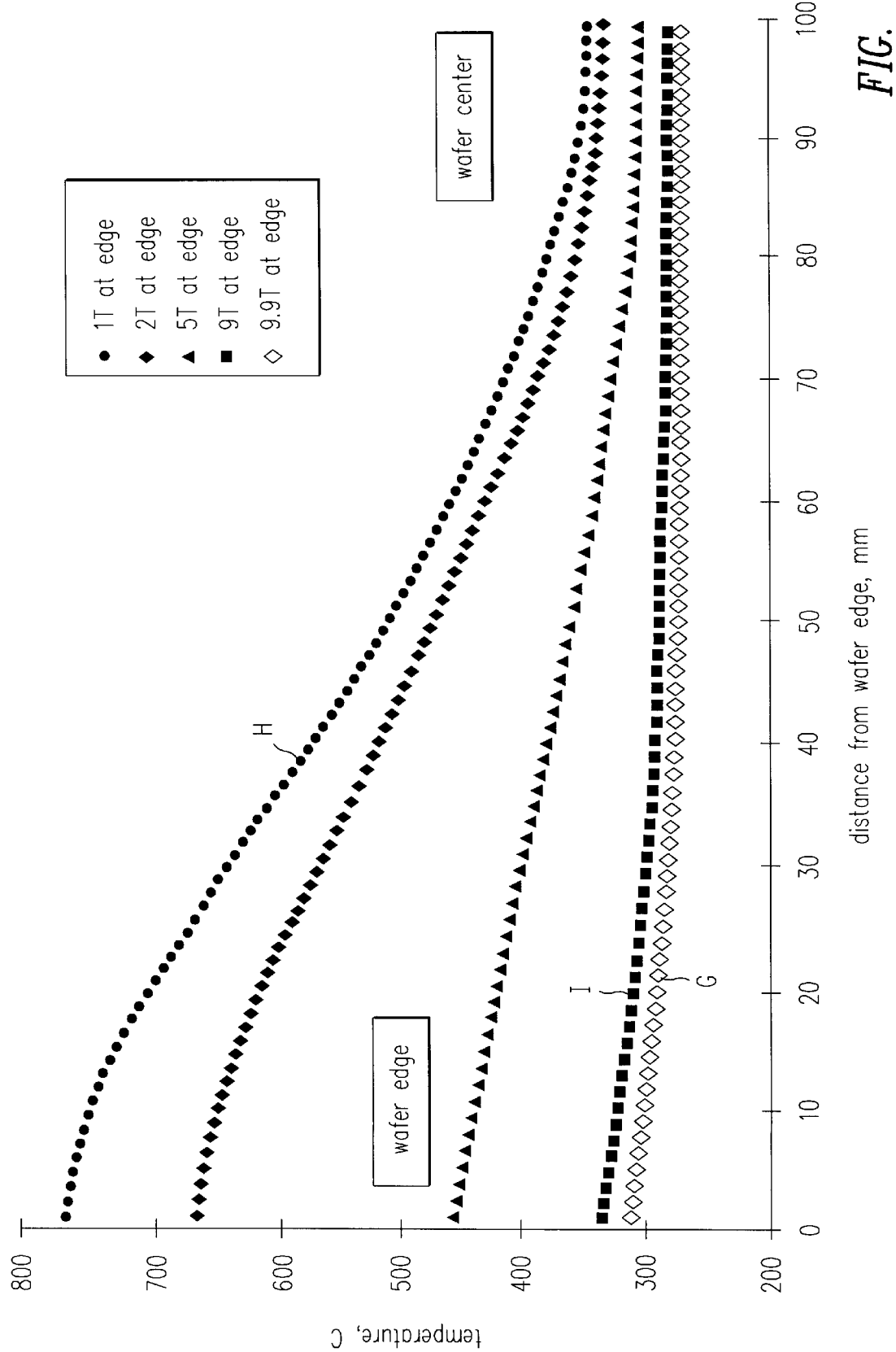
FIG. 14 is a graph which illustrates the effects of pressure non-uniformity on wafer temperature for a WCD in accordance with the present invention.

FIG. 14 is a graph which illustrates the effects of backside pressure variations on wafer temperature. Shown in FIG. 14 are estimated temperature profiles for five different backside pressure drops between the center and edge of a wafer. FIG. 14 assumes a heat load of 2000 watts delivered to a 200 mm diameter wafer. The backside gas, helium, was supplied at 10 Torr through a centrally located gas feed. Ceramic disk 52 was held at 60° C. For a backside gas pressure drop of only 1 percent between the center and edge of the wafer (10.0 Torr at center, 9.9 Torr at edge), a substantially uniform wafer temperature profile is expected, as shown in curve G. However for a 90% backside gas pressure drop (10.0 Torr at center, 1.0 Torr at edge), wafer edge temperatures in excess of 700° C. are expected as shown in curve H. Acceptable wafer temperature profiles (maximum temperature across the wafer surface below 400° C.) are obtained with backside gas pressure drops of less than 10 percent (10.0 Torr at center, 9.0 Torr at edge) as shown in curve I. Thus it is desirable to avoid variations in the backside gas pressure of more than ten percent.

Another advantage of having a substantially uniform backside gas pressure is that lower overall wafer temperatures are obtained. This is because as the variation in backside gas pressure decreases, the average pressure behind the wafer rises, as does the average heat transfer coefficient. Thus, the overall wafer temperature drops, even at the wafer center. To illustrate, the temperature at the wafer center in curve G (1% variation) is substantially cooler than the temperature at the wafer center in curve H (90% variation) even though the backside gas pressure at the wafer center equals the inlet pressure of 10 Torr in both examples.

As shown in curve G, even when backside gas pressure varies by only one percent, the wafer edge is at a slightly higher temperature than the wafer center. This is because the wafer overhangs the edge of the WCD slightly, by approximately 1.0 mm, to accommodate tolerances in the placement of the wafer on the WCD, and the portion that overhangs sees little or no cooling other than by heat conduction through the wafer itself.

To contain the gas, a continuous annular ring 78 formed at the periphery of ceramic disk 52 (see FIGS. 10a, 11a and 11b) provides a seal between wafer 62 and ceramic disk 52. Referring to FIG. 11b, the raised surface area 78' of annular ring 78, and the raised surface areas 72' of dots 72 are substantially coplanar, with an average deviation of less than 0.1 mm from a hypothetical mean plane generally parallel to surfaces 72', 78'. Ideally, with a perfect seal and no gas movement, there would be no pressure variation behind the wafer. However, realistically there will be some gas leakage past annular ring 78.

As discussed above, the WCD and hence annular ring 78 has a slightly smaller diameter than the wafer to accommodate for wafer placement tolerances. If the wafer is misplaced such that a portion of annular ring 78 does not contact a portion of the wafer, then the seal formed by annular ring 78 and the wafer is breached. When the seal is breached, the leak rate increases abruptly.

Even when the seal is not breached due to wafer misplacement, the seal will still leak. For a given leak rate q at the seal formed by the wafer 62 and the annular ring 78, the pressure distribution will be governed by the seal conductance $C_S$ as set forth in the following equation:

$$q = C_S * \Delta P \tag{3}$$

where $\Delta P$ is the pressure drop across the seal.

The seal conductance ($C_S$) depends upon several factors. One factor is the roughness of the contact surfaces that create the seal, i.e. the roughness of the surface of annular ring 78 and the roughness of the surface of the wafer 62 which contacts annular ring 78. Another factor is the presence of hard particles on the contact surfaces that create the seal. The magnitude of the clamping force between the contact surfaces that create the seal also effects the seal conductance. Since these factors are difficult to predict, the seal conductance is also difficult to predict. However, some control over the seal conductance can be obtained by increasing the width (shown as $W_S$ in FIGS. 11a and 11b) of annular ring 78, with larger widths producing smaller seal conductances and hence smaller leak rates.

For any given seal conductance, the maximum seal leak rate occurs when the pressure drop across the seal equals the maximum possible pressure drop according to equation 3. The maximum possible pressure drop is the difference between the backside gas inlet pressure (the pressure cannot exceed the backside gas inlet pressure) and the pressure in the vacuum chamber which for a 5 mTorr operating pressure is essentially zero for the purposes of these calculations. To limit variations in the backside gas pressure, the surface (82) pattern of ceramic disk 52 must permit flow rates in excess of the maximum seal leak rate. This occurs when the inner surface conductance (the gas flow conductance from the center of ceramic disk 52 to annular ring 78 in the gap formed by the wafer and ceramic disk 52) is much greater than the seal conductance.

The inner surface conductance depends upon the dot height $H_D$, since this sets the spacing through which gas flows. In WCDs having a greater dot height $H_D$ the inner surface conductance is improved. However, as discussed previously, it is desirable to keep the dot height $H_D$ below 40 μm to prevent heat transfer performance from degrading.

Figure 18:
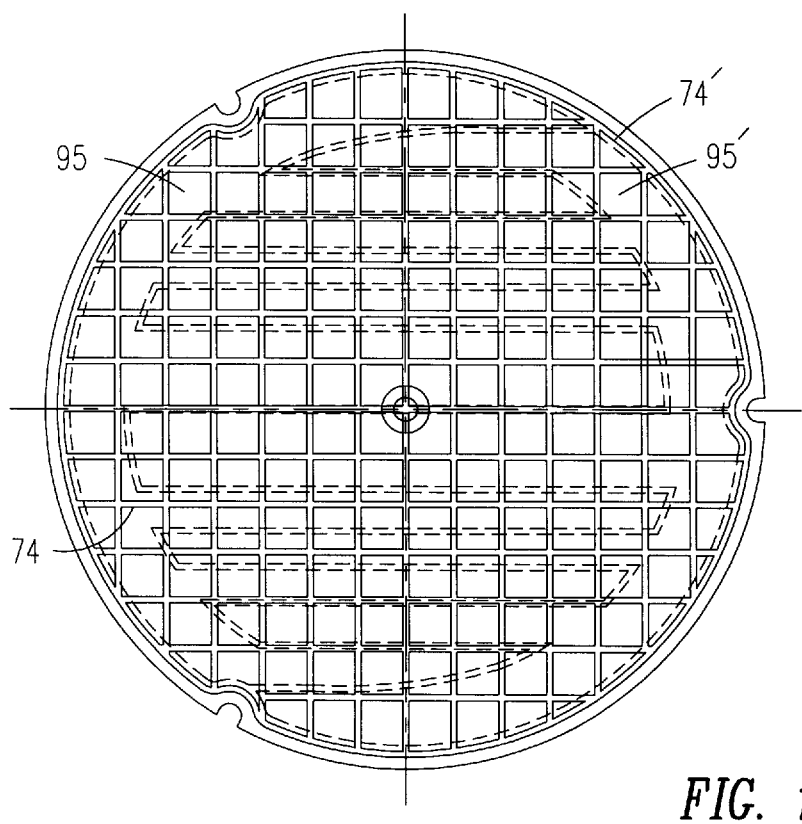
FIGS. 15a, 16a, 17a, 18 and 19a illustrate top views of WCDs with various configurations of gas distribution channels in accordance with alternative embodiments of the present invention.
Figure 10B:
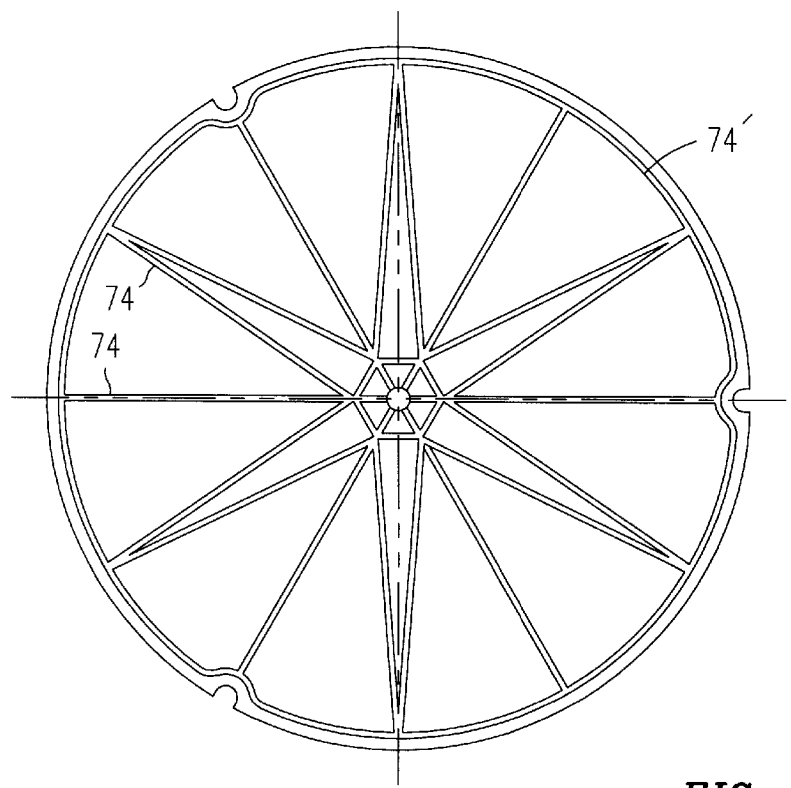

To improve inner surface conductance, gas distribution channels (shown as 74, 74' in FIGS. 10a, 10b, 11a and 11b)

are used. As shown in FIG. 10b, 18 gas distribution channels 74 radiate outward from a hexagonal pattern of channels at the center of the WCD. To insure that there are sufficient dots 72 at the center of ceramic disk 52, only six gas distribution channels are used inside of the hexagonal pattern to distribute gas from the central gas inlet port. The gas distribution channels supply gas to annular ring 78 to replace gas which leaks across the seal formed by annular ring 78 and the wafer, and to the vacuum chamber. Referring to FIG. 11b, gas distribution channels 74, 74' are rectangular in cross section and have a depth $D_C$ and a width $W_C$. In one embodiment, the width $W_C$ of gas distribution channels 74, 74' is approximately 1500 µm, and the depth $D_C$ is approximately 700 µm. It is desirable that the width $W_C$ of gas distribution channels 74, 74' is within the range of approximately 0.5 to 2.5 mm, and that the depth $D_C$ is within the range of approximately 0.2 to 2.0 mm, with tolerances within 10% of the values selected.

The depth $D_C$ of gas distribution channels 74, 74' is a design choice which is based upon several factors. First, as the depth $D_C$ is increased, the electrode(s)/wafer spacing is correspondingly increased which increases the response time of the electrostatic clamping force, i.e. clamping/unclamping time is increased. Also, as the electrode(s)/wafer spacing is increased, RF coupling efficiency to the wafer is decreased. Furthermore, owing to differences in the respective dielectric constants of the gas within the gas distribution channels and the material of which ceramic disk 52 is made, the channels tend to introduce irregularities into the electric field which is coupled from the electrode(s) to the wafer. Also, as the depth $D_C$ is increased, the probability of voltage breakdown between the electrode(s) and the wafer is also increased and the strength of ceramic disk 52 is decreased. Thus as those skilled in the art will understand, the maximum depth of the gas distribution channels is a design choice which is based on the foregoing factors.

Figure 15A:
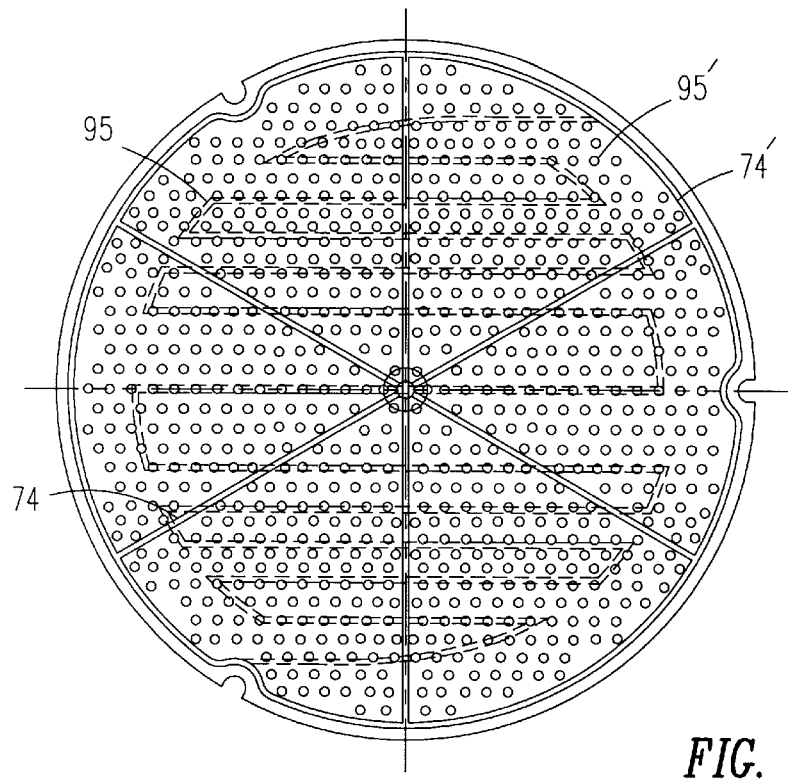
Figure 15B:
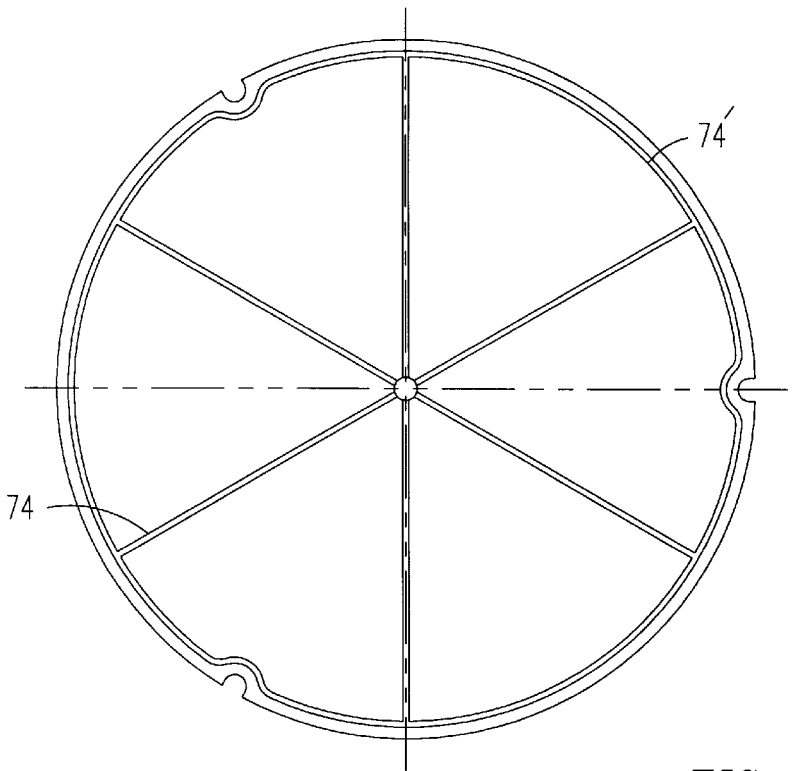
FIGS. 15b, 16b, 17b and 19b further illustrate the gas distribution channels for the embodiments shown in FIGS. 15a, 16a, 17a, and 19a, respectively.
Figure 16A:
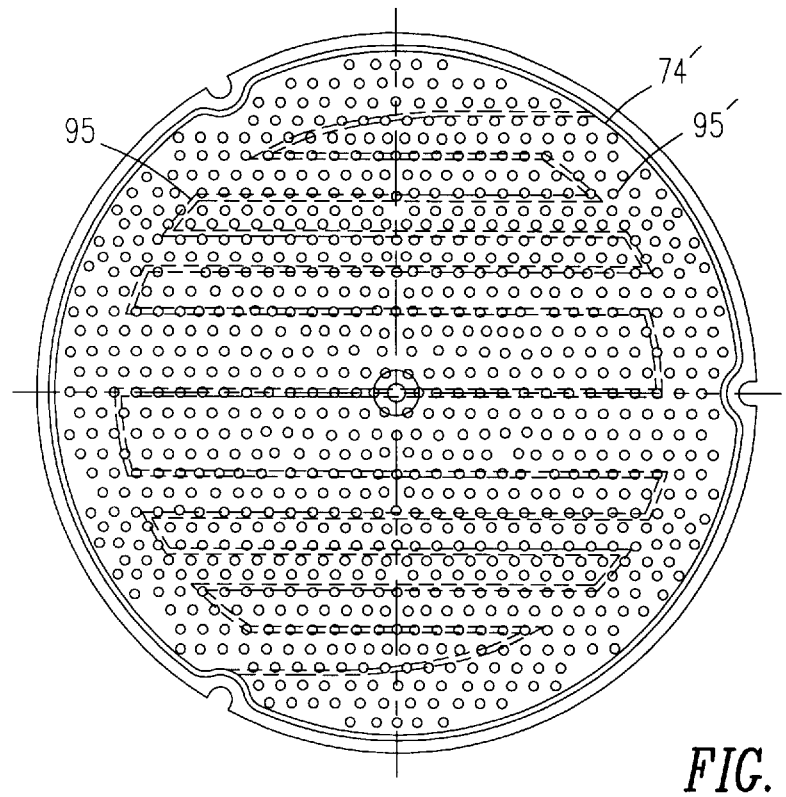
Figure 16B:
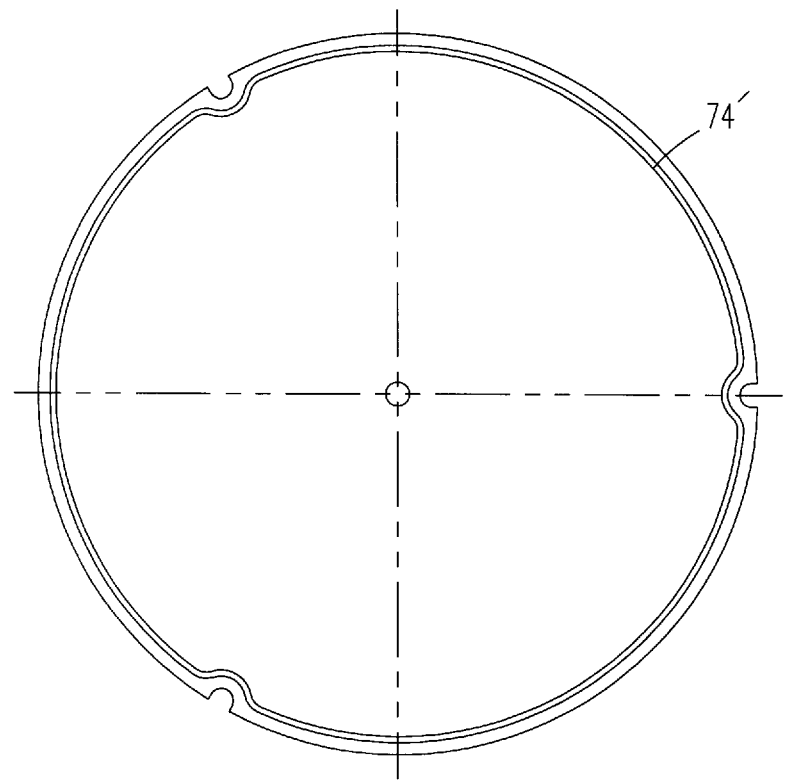
Figure 17A:
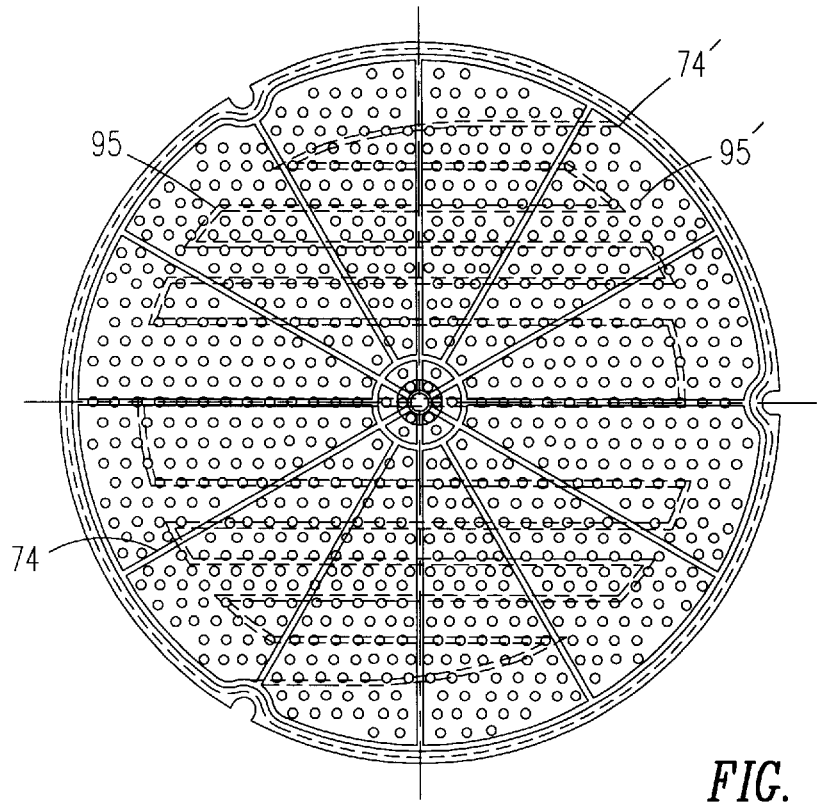
Figure 17B:
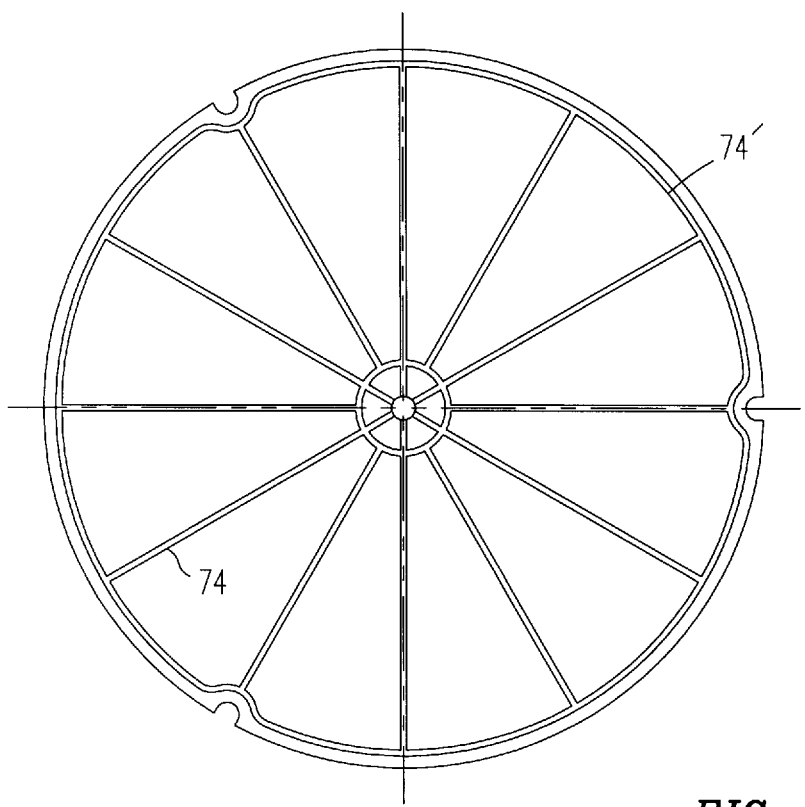

Shown in FIGS. 15a, 16a, 17a, 18 and 19a are alternative embodiments of the present invention with various configurations of gas distribution channels. FIG. 15a shows an WCD having six gas distribution channels which radiate outward in a spoke pattern from the center of the WCD. FIG. 16a shows a WCD having a single circular gas distribution channel located adjacent annular ring 78. FIG. 17a shows a WCD having 12 gas distribution channels radiating outward from a central circular gas distribution channel. FIG. 18 shows a WCD having gas distribution channels arranged in a cross hatch pattern. FIGS. 15b, 16b and 17b further illustrate the gas distribution channels of the embodiments shown in FIGS. 15a, 16a and 17a, respectively.

Figure 19A:
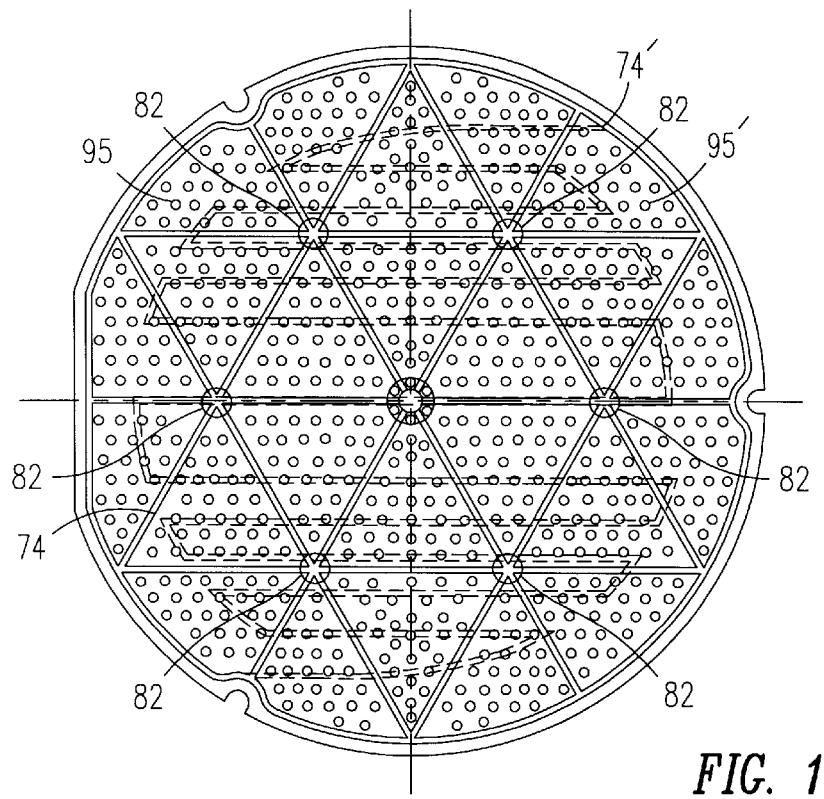
Figure 19B:
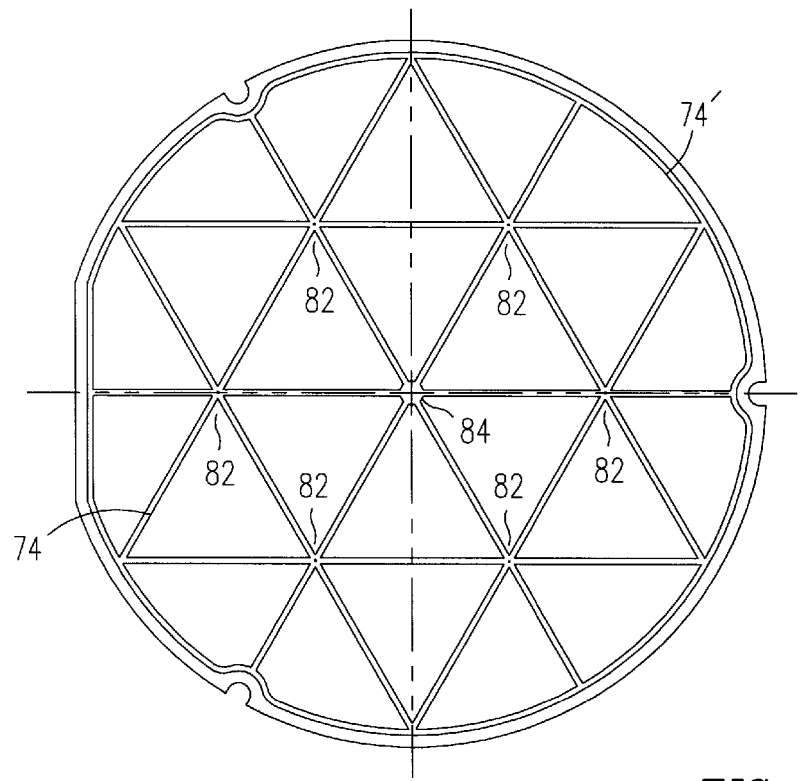

FIGS. 19a and 19b illustrate an alternative embodiment having six small backside gas inlet ports 82 (typically with diameters less than 3.0 mm), a large central gas inlet port 84, and gas distribution channels which are arranged in a triangular pattern. Gas distribution channels are formed within metallic support disk 56 to feed gas to the six small backside gas inlet ports 82. Using multiple gas inlet ports 82 reduces any variation in the backside gas pressure. However, gas inlet ports 82 tend to form a low impedance path to ground for RF which increases the potential for arcing and hence failure of the WCD.

In all of the embodiments, the central gas inlet port shown has a typical diameter of 4.7 mm and is fed with gas from a gas inlet tube (110 in FIG. 4). In FIGS. 10a, 15a, 16a, 17a, 18 and 19a, the outlines of encapsulated interdigitated finger electrodes 95, 95' which form the bipolar electrostatic chuck mechanism within ceramic disk 52, are illustrated using dashed lines. The thickness of electrodes 95 and 95' must be sufficient to couple RF power and offer a low impedance path for RF current. Electrodes with thicknesses between the range of approximately 15 to 45 µm and typically 30 µ, are sufficient. In all of the embodiments, an annular gas distribution channel 74' is shown. This annular gas distribution channel distributes gas around the seal formed by annular ring 78 and the wafer, thus reducing any pressure variations caused by any localized seal leaks. Wafers with various diameters, for example 150, 200 and 300 mm diameter wafers, can be used with all of the embodiments. In particular, the embodiments shown in FIGS. 15a and 10a have been found to be well suited for use with 150 mm and 200 mm diameter wafers, respectively.

Predicted WCD characteristics are given below in Table 2 for the embodiments shown in FIGS. 10a, 15a, 17a, 18 and 19a.

TABLE 2

| Embodiment | Embodiment according to: | Seal Width (mm) | Channel depth (µm) | Wafer Edge Pressure (Torr) | Seal Leak Rate (SCCM) | Inner Surface Flow (SCCM) |
|---|---|---|---|---|---|---|
| 1 | FIG. 19a | 2 | 700 | 9.7 | 14.6 | 50.00 |
| 2 | FIG. 15a | 4 | 200 | 1.8 | 2.7 | 0.33 |
| 3 | FIG. 15a | 2 | 300 | 3.1 | 4.6 | 0.66 |
| 4 | FIG. 15a | 2 | 700 | 8.5 | 12.8 | 8.60 |
| 5 | FIG. 15a | 2 | 2000 | 9.7 | 14.6 | 50.00 |
| 6 | FIG. 17a | 2 | 200 | 1.8 | 2.7 | 0.33 |
| 7 | FIG. 17a | 4 | 200 | 3.1 | 2.3 | 0.33 |
| 8 | FIG. 10a | 4 | 200 | 4.0 | 3.0 | 0.50 |
| 9 | FIG. 10a | 4 | 300 | 7.3 | 5.5 | 2.00 |
| 10 | FIG. 10a | 2 | 700 | 9.5 | 14.2 | 26.00 |
| 11 | FIG. 10a | 4 | 700 | 9.7 | 7.3 | 26.00 |
| 12 | FIG. 18 | 2 | 300 | 4.3 | 6.5 | 1.10 |
| 13 | FIG. 18 | 4 | 300 | 6.0 | 4.5 | 1.10 |
| 14 | FIG. 18 | 2 | 700 | 9.1 | 13.5 | 14.50 |

In all of the embodiments shown in Table 2, the channel width was 1500 µm. The wafer edge pressure is the backside gas pressure at the inner edge of annular ring 78. The seal leak rate is the expected leak rate at the seal formed by the wafer and annular ring 78 for the corresponding wafer edge pressure shown in Table 2. The inner surface flow is the expected flow across the ceramic disk surface 82 when the backside gas pressure is 10.0 Torr at the wafer center and 9.0 Torr at the wafer edge (10% variation in backside gas pressure).

As shown in Table 2, in Embodiment 1 (FIG. 19a), the pressure varies 0.3 Torr across the inner surface from the inlet pressure of 10 Torr at the wafer center to 9.7 Torr at the wafer edge. Thus, in Embodiment 1, the backside gas pressure variation is 3%. Similarly, in Embodiments 5, 10, 11 and 14 the backside gas pressure variation is 3%, 5%, 3% and 9%, respectively. In Embodiment 1, the inner surface flow rate across the ceramic disk surface 82 is 50.00 SCCM (for a 1 Torr pressure drop between the wafer center and edge), which far exceeds the expected seal leak rate of 14.6 SCCM. This provides a measure of tolerance to accommodate higher seal leak rates which may result, for example, from wafer misalignment or particulate. Similarly, in Embodiments 5, 10 and 11, the inner surface flow rate of 50.00, 26.00 and 26.00 SCCM across the ceramic disk surface 52 substantially exceeds the expected maximum seal leak rate of 14.6, 14.2 and 7.3 SCCM, respectively, thus also providing a measure of tolerance to accommodate higher seal leak rates.

Expected heat transfer coefficients for Embodiments 1, 2, 5, 9 and 10 in Table 2 are given below in Table 3. Heat transfer coefficients given are for gas heat conduction only. In all of the embodiments, the heat transfer coefficient for contact heat conduction is within the range of approximately 5 to 30 W/M²-K depending upon the wafer surface roughness, with rougher wafer surfaces resulting in lower heat transfer coefficients.

TABLE 3

| Embodiment | % Variation | Heat Transfer Coefficient, Wafer Center (W/M² – K) | Heat Transfer Coefficient, Wafer Edge (W/M² – K) |
| --- | --- | --- | --- |
| 1 | 3% | 297 | 255 |
| 2 | 82% | 223 | 89 |
| 5 | 3% | 297 | 255 |
| 9 | 27% | 279 | 204 |
| 10 | 5% | 295 | 243 |

Table 3 illustrates that embodiments with less variation in backside gas pressure have less variation in the heat transfer coefficients between the wafer center and edge. For example, in Embodiment 1, which has a backside gas pressure variation of 3%, the heat transfer coefficients at the wafer center and edge are 297 and 255 W/M²-K, respectively, for a variation of 42 W/M²-K. However, in Embodiment 2, which has a much greater backside gas pressure variation of 82%, the heat transfer coefficients at the wafer center and edge are 223 and 89 W/M²-K, respectively, for a variation of 134 W/M²-K. Less variation in the heat transfer coefficient improves the wafer temperature profile as illustrated in FIG. 20.

Figure 20:
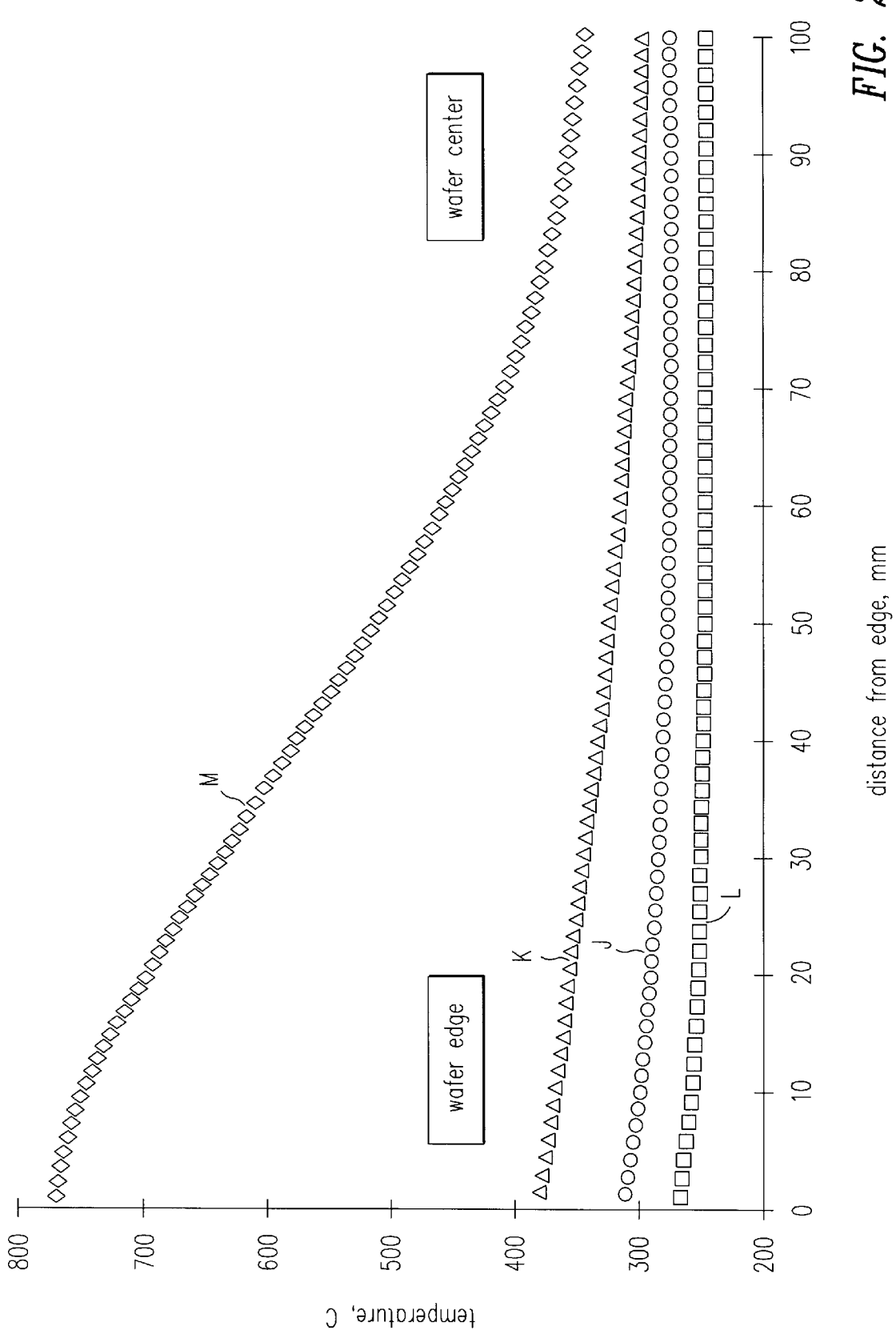
FIG. 20 is a graph which illustrates wafer temperature profiles for several WCDs in accordance with alternative embodiments of the present invention.

In FIG. 20, wafer temperature profiles for Embodiments 1 and 9 are shown in curves J and K, respectively, assuming a rough wafer surface (heat transfer coefficient for contact heat conduction equal to approximately 5 W/M²-K). Wafer temperature profiles for Embodiment 2 with a smooth wafer surface and with a rough wafer surface area are shown in curves L and M, respectively. The heat transfer coefficients for contact heat conduction are 500, 30 W/M²-K for curves L and M, respectively. FIG. 20 assumes a heat load of 2000 watts delivered to a 200 mm diameter wafer. The backside gas, helium, was supplied at 10 Torr through a centrally located gas feed. Ceramic disk 52 was held at 60° C.

As shown in curve M, wafer edge temperatures in excess of 700° C. are obtained in Embodiment 2 with a wafer having a rough surface. However, as shown in curve L, when the wafer surface is polished a substantially uniform wafer temperature profile is obtained due to dominant contact heat conduction. However, the ability to readily control wafer temperature through backside gas pressure is compromised since contact heat conduction is the dominant heat transfer mechanism.

As shown by curve J, a substantially uniform wafer temperature profile, wherein the maximum wafer temperature is below 350° C, is obtained with Embodiment 1. Most important, since gas heat conduction dominates in Embodiment 1, wafer temperature is readily controlled by adjusting the backside gas pressure.

In curve K, the wafer temperature profile for Embodiment 9 is shown. Curve K illustrates the effects of moderate pressure variation on wafer temperature. As shown, even with pressure variation of only 27%, wafer edge temperatures in excess of 350° C. are obtained.

Figure 21:
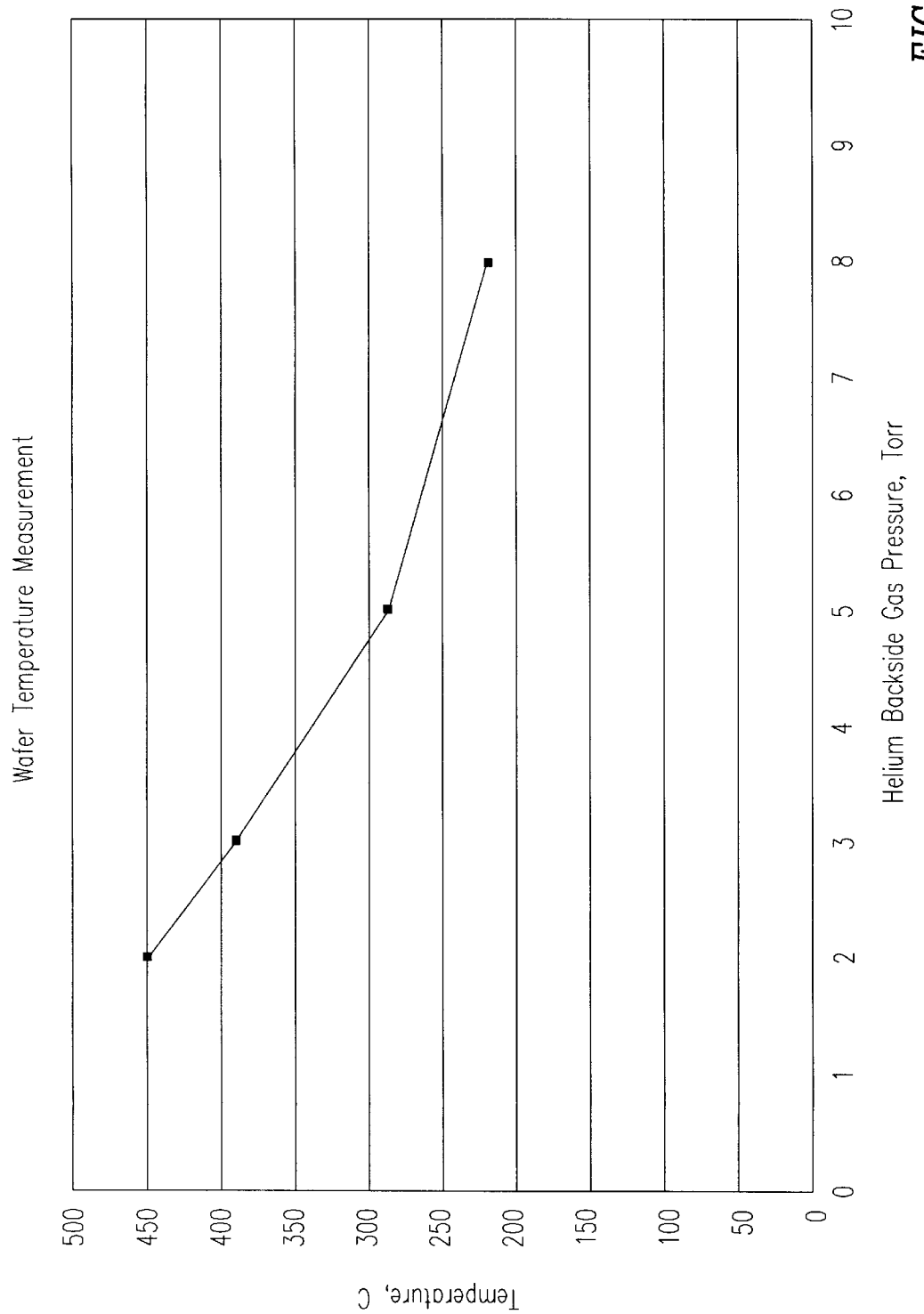
FIG. 21 is a graph which illustrates temperature versus backside gas pressure at the center of a WCD in accordance with the present invention.

FIG. 21 is a graph which illustrates temperature versus backside gas pressure at the center of a WCD in accordance with the present invention. FIG. 21 assumes a heat load of 2000 watts delivered to a 200 mm diameter wafer. At an 8 torr backside gas pressure, the wafer temperature is held to approximately 225° C. However, by reducing the backside gas pressure to 5 Torr, the wafer temperature can be adjusted to approximately 275° C. As shown, the wafer temperature can be further increased by further reducing the backside gas pressure. Thus FIG. 21 illustrates that wafer temperature can be readily controlled by adjusting backside gas pressure.

Figure 22A:
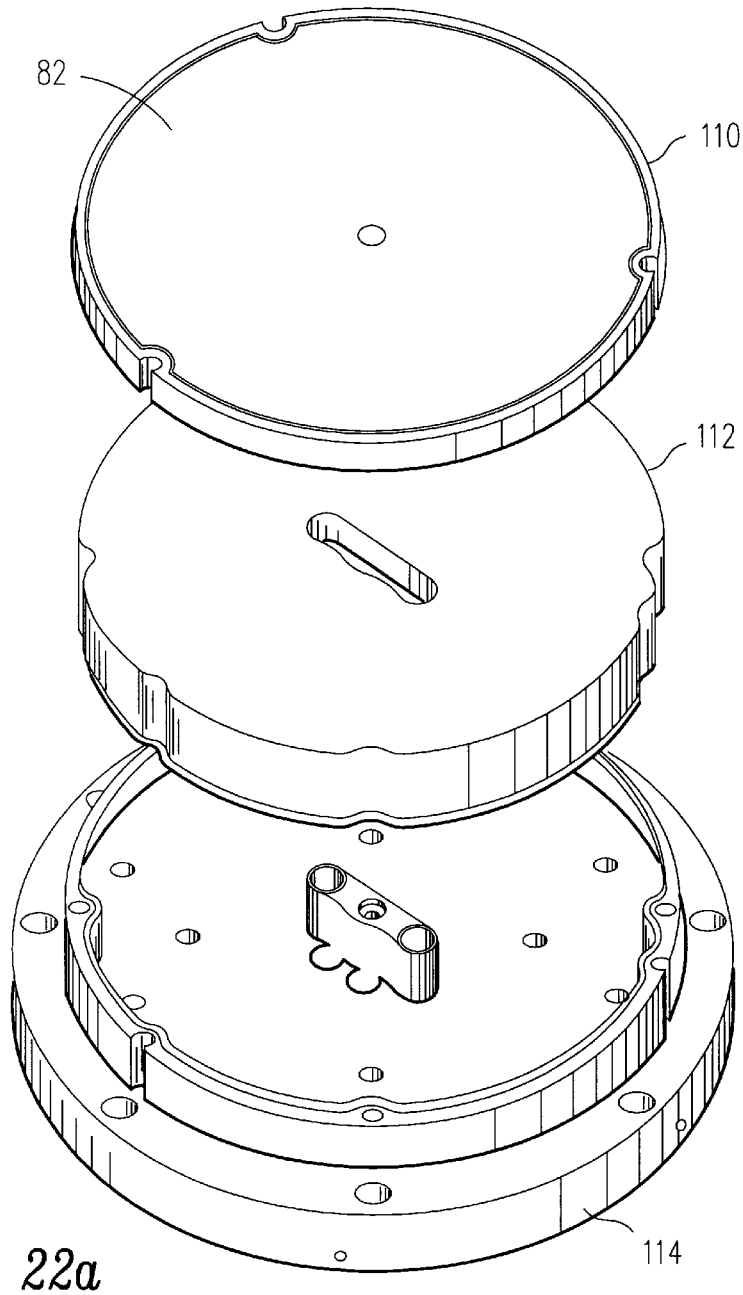
FIGS. 22a and 22b are exploded top isometric and cross sectional views of an alternative embodiment of the present invention in which the ceramic disk is brazed or soldered directly on to the metallic cooling disk.
Figure 22B:
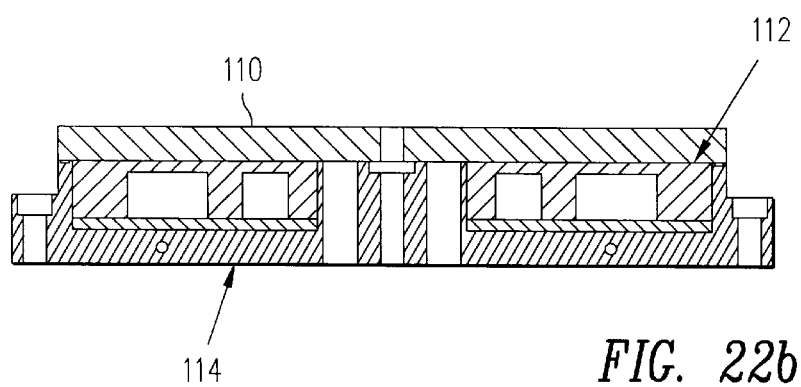

Shown in FIGS. 22a and 22b, collectively referred to as FIG. 22, are exploded top isometric and cross sectional views of an alternative embodiment of the present invention, respectively. In this embodiment, ceramic disk 110 is brazed or soldered onto metallic cooling disk 112, using indium solder for example. The braze or solder material must have sufficient flexibility to allow for differential thermal expansion between ceramic disk 110 and metallic cooling disk 112. Ceramic disk 110, and metallic cooling disk 112 are substantially identical to ceramic disk 52 and metallic cooling disk 60 shown in FIG. 2, respectively. Metallic cooling disk 112 is then bolted into a cavity formed in metallic support disk 114.

The embodiment illustrated in FIG. 22 eliminates the first and second layers (54, 58 in FIG. 2, respectively) of thermally conductive paste. This is advantageous since the possibility of leakage of thermally conductive paste past O-ring 55 (FIG. 2), with the associated contamination of the vacuum process environment is eliminated. Another advantage is that wafer input heat moves from the wafer, through ceramic disk 110, across the brazing or soldering layer, then directly to the metallic cooling disk 112. This improves the heat transfer capability of the WCD since heat is not conducted across metallic support disk 114. It should be understood that the design considerations for the contact surface 82 of the ceramic disk 52 (or 110) are identical for the embodiments shown in FIGS. 2 and 22.

The foregoing has described the principles and preferred embodiments of the present invention. However, the invention should not be construed as being limited to the particular embodiments described. For example, ceramic disks with various thermal conductivities can be used. The WCD can be fashioned in a variety of shapes, such as triangular or rectangular. Also, other metals or materials other than aluminum for the support disk and brass for the cooling disk can be used. Further, the backside gas pressure at the wafer center can be increased above 10 Torr if higher input power levels are used. Further, the substrate can be a silicon, gallium arsenide or ceramic wafer, or a substrate used in the manufacture of thin film heads or flat panel displays. Further, the WCD can be used in various plasma processes, such as chemical vapor deposition (CVD), plasma enhanced chemical vapor deposition (PECVD), plasma etch, sputter etch, and physical vapor deposition (PVD) processes. Thus, above-described embodiments should be regarded as illustrative rather than restrictive. Variations can be made to those embodiments by workers skilled in the art without departing from the scope of the present invention as defined by the following claims.

We claim:

1. A substrate cooling device for removing heat from a substrate, comprising:
   a substrate contact plate, said substrate contact plate comprising:
   a peripheral raised region;
   a central region, said central region comprising an array of protuberances and a recessed region, said recessed region forming a cavity, an area of said recessed region occupying from 80% to 98% of an area of said central region, each of said protuberances terminating in a contact surface, said contact surfaces having an average roughness (Ra) in the range of 0.35 µm to 3.0 µm, a surface of said peripheral raised region and said contact surfaces being substantially coplanar; and at least one gas inlet channel for introducing a gas into said cavity; and a cooling plate thermally coupled to said substrate contact plate, said cooling plate comprising a channel for passing a liquid coolant.

2. The substrate cooling device of claim 1 further comprising a support plate attached to at least one of said substrate contact plate and said cooling plate.

3. The substrate cooling device of claim 2 wherein said support plate is interposed between said substrate contact plate and said cooling plate.

4. The substrate cooling device of claim 3 further comprising:

a first layer of thermally conductive paste between a backside of said substrate contact plate and a first surface of said support plate; and a second layer of thermally conductive paste between a second surface of said support plate and said cooling plate.

5. The substrate cooling device of claim 4 further comprising a first seal for protecting said first layer of thermally conductive paste from a vacuum environment surrounding said substrate cooling device.

6. The substrate cooling device of claim 5 further comprising a second seal for protecting said first layer of thermally conductive paste from a vacuum environment within said at least one gas inlet channel.

7. The substrate cooling device of claim 4 wherein said substrate contact plate is formed of a ceramic material.

8. The substrate cooling device of claim 3 further comprising a plurality of bolts for attaching said support plate to said substrate contact plate.

9. The substrate cooling device of claim 8 wherein a belleville spring washer is used with each of said bolts to provide flexibility and thereby accommodate a difference between the respective thermal expansion properties of said support plate and said substrate contact plate.

10. The substrate cooling device of claim 2 wherein said cooling plate is interposed between said substrate contact plate and said support plate.

11. The substrate cooling device of claim 10 wherein said substrate contact plate is soldered or brazed to said cooling plate.

12. The substrate cooling device of claim 1 wherein said peripheral raised region comprises an annular seal ring.

13. The substrate cooling device of claim 12 wherein said at least one gas inlet channel opens into said cavity at a gas inlet port located at or near a center of said central region.

14. The substrate cooling device of claim 12 further comprising an annular gas distribution ring located adjacent an inside edge of said annular seal ring.

15. The substrate cooling device of claim 14 wherein said central region further comprises a pattern of gas distribution channels extending from said at least one gas inlet port to said annular gas distribution ring.

16. The substrate cooling device of claim 15 wherein said gas distribution channels have a depth in the range of 0.2–2.0 mm and a width in the range of 0.5–2.5 mm.

17. The substrate cooling device of claim 16 wherein said gas distribution channels have a depth of approximately 0.7 mm and a width of approximately 1.5 mm.

18. The substrate cooling device of claim 15 wherein said pattern comprises an intermediate channel in the shape of a closed figure surrounding said at least one gas inlet port, a first group of channels extending from said gas inlet port to said intermediate channel, and a second group of channels extending from said intermediate channel to said annular gas distribution ring, said second group of channels being greater in number than said first group of channels.

19. The substrate cooling device of claim 18 wherein said closed figure is a hexagon and said first group consists of six channels and said second group consists of eighteen channels, each of the channels in said first and second groups intersecting a corner of said hexagon.

20. The substrate cooling device of claim 15 wherein said gas distribution channels radiate outward in a spoke pattern from said gas inlet port.

21. The substrate cooling device of claim 20 wherein said substrate cooling device comprises at least six of said gas distribution channels.

22. The substrate cooling device of claim 21 wherein said substrate cooling device comprises at least twelve of said gas distribution channels.

23. The substrate cooling device of claim 15 wherein said gas distribution channels are arranged in a triangular pattern.

24. The substrate cooling device of claim 15 wherein said gas distribution channels are arranged in a cross hatch pattern.

25. The substrate cooling device of claim 1 further comprising a means for clamping a substrate to said substrate contact plate.

26. The substrate cooling device of claim 1 wherein said substrate contact plate further comprises at least one electrode for clamping a substrate to said substrate contact plate.

27. The substrate cooling device of claim 26 wherein said substrate contact plate comprises a pair of interdigitated electrodes.

28. The substrate cooling device of claim 26 wherein said at least one electrode is from 15 µm to 45 µm thick.

29. The substrate cooling device of claim 26 further comprising a source of voltage connected to said at least one electrode for providing an electrostatic force for clamping said substrate to said substrate contact plate.

30. The substrate cooling device of claim 26 further comprising a source of RF power connected to said at least one electrode.

31. The substrate cooling device of claim 26 further comprising a source of RF power and a metallic support plate attached to at least one of said substrate contact plate and said cooling plate, said source of RF power being connected to said at least one electrode and said metallic support plate.

32. The substrate cooling device of claim 1 wherein a depth of said cavity is less than or equal to 40 micrometers (µm) and is manufactured within a tolerance of ±10% of a selected value.

33. The substrate cooling device of claim 1 wherein the deviation from a mean plane of said surface of said peripheral raised region and said contact surfaces is less than 0.1 millimeter.

34. The substrate cooling device of claim 1 wherein said surface of said peripheral raised region and said contact surfaces are polished or ground surfaces.

35. The substrate cooling device of claim 34 wherein a texture of said surface of said peripheral raised region and said contact surfaces is random.

36. The substrate cooling device of claim 1 wherein $R_{max}$ of said contact surfaces is less than or equal to 200% of Ra.

37. A combination comprising the substrate cooling device of claim 1 and a substrate supported on said substrate contact plate, a surface of said substrate being in contact with said raised region and said contact surfaces, a gas being introduced into said cavity through said at least one gas inlet channel.

38. The combination of claim 37 wherein said gas is selected from the group which consists of hydrogen, helium, nitrogen and argon.

39. The combination of claim 37 wherein a pressure of said gas in said cavity is at or below approximately 20 Torr.

40. The combination of claim 37 wherein said substrate receives power from a source external to said substrate cooling device, a temperature of said substrate being controlled by said gas pressure.

41. The combination of claim 40 wherein less than approximately 20% of said heat removed from said substrate is removed through said protuberances.

42. The combination of claim 37 wherein a roughness of said surface of said peripheral raised region and said contact surfaces are greater than or equal to a roughness of a surface of said substrate in contact with said substrate cooling device.

43. The combination of claim 37 further comprising:
a pressure control valve for controlling a pressure of a gas in said at least one gas inlet channel;
a pressure sensor for sensing a pressure of said gas in said at least one gas inlet channel;
a controller linked to said pressure control valve and said pressure sensor;
wherein said controller receives a signal from said pressure sensor and responsive thereto delivers a signal to said pressure control valve to maintain a pressure in said at least one gas inlet channel.

44. The combination of claim 37 further comprising:
a pressure control valve for controlling a pressure of a gas in said at least one gas inlet channel;
a temperature sensor for sensing a temperature of said substrate;
a controller linked to said pressure control valve and said temperature sensor;
wherein said controller receives a signal from said temperature sensor and responsive thereto delivers a signal to said pressure control valve to maintain a temperature of said substrate.

45. A chemical vapor reaction system comprising a reaction chamber and a wafer cooling device according to claim 1, said wafer cooling device being positioned to support a wafer in said reaction chamber.

46. The chemical vapor reaction system of claim 45 wherein said chemical vapor reaction system comprises a chemical vapor deposition system.

47. The chemical vapor reaction system of claim 45 wherein said chemical vapor reaction system comprises a plasma-enhanced chemical vapor deposition system.

48. The chemical vapor reaction system of claim 45 wherein said chemical vapor reaction system comprises a plasma etch system.

49. The chemical vapor reaction system of claim 45 wherein said chemical vapor reaction system comprises a sputter etch system.

50. The chemical vapor reaction system of claim 45 wherein said chemical vapor reaction system comprises a physical vapor deposition system.

51. A wafer cooling device comprising:
a ceramic disk, said ceramic disk having a top surface which comprises a raised annular ring extending along the periphery thereof and a central region inside said raised annular ring, said central region comprising a recessed area and an array of dots, said recessed area occupying from 80% to 98% of an area of said central region, each of said dots terminating in a contact surface, said contact surfaces having an average roughness (Ra) in the range of 0.35 $\mu$m to 3.0 $\mu$m, a surface of said raised annular ring and said contact surfaces being substantially coplanar, said central region further comprising a gas inlet port;
a pair of interdigitated electrodes encapsulated in said ceramic disk for providing an electrostatic force to clamp a wafer to said ceramic disk;
a metallic support disk attached to a backside of said ceramic disk;
a cooling disk attached to a backside of said metallic support disk, said cooling disk having formed therein a channel for passing a liquid coolant; and
a gas inlet channel extending through said cooling disk and said metallic support disk to said gas inlet port.

52. The wafer cooling device of claim 51 wherein a first layer of thermally conductive paste connects said ceramic disk to said metallic support disk and a second layer of thermally conductive paste connects said metallic support disk to said cooling disk.

53. The wafer cooling device of claim 52 further comprising a first O-ring for protecting said first layer of thermally conductive paste from a vacuum environment surrounding said wafer cooling device and a second O-ring for protecting said first layer of thermally conductive paste from a vacuum environment in said gas inlet channel.

54. The wafer cooling device of claim 51 further comprising a plurality of bolts for attaching said metallic support disk to said ceramic disk.

55. The wafer cooling device of claim 54 wherein a belleville spring washer is used with each of said bolts to provide flexibility and thereby accommodate a difference between the respective thermal expansion properties of said metallic support disk and said ceramic disk.

56. The wafer cooling device of claim 51 further comprising an annular gas distribution ring located adjacent an inside edge of said raised annular ring.

57. The wafer cooling device of claim 56 wherein said central region further comprises a plurality of gas distribution channels extending from said gas inlet port to said annular gas distribution ring.

58. The wafer cooling device of claim 51 wherein a surface of said raised annular ring is designed to form a partial seal with a surface of a wafer supported on said ceramic disk.

59. A wafer cooling device comprising:
a ceramic disk, said ceramic disk having a top surface which comprises a raised annular ring extending along the periphery thereof and a central region inside said raised annular ring, said central region comprising a recessed area and an array of dots, said recessed area occupying from 80% to 98% of an area of said central region, each of said dots terminating in a contact surface, said contact surfaces having an average roughness (Ra) in the range of 0.35 $\mu$m to 3.0 $\mu$m, a surface of said raised annular ring and said contact surfaces being substantially coplanar, said central region further comprising a gas inlet port;
a pair of interdigitated electrodes encapsulated in said ceramic disk for providing an electrostatic force to clamp a wafer to said ceramic disk;
a cooling disk attached to a backside of said ceramic disk, said cooling disk having formed therein a channel for passing a liquid coolant;

a metallic support disk attached to a backside of said cooling disk; and a gas inlet channel extending through said metallic support disk and said cooling disk to said gas inlet port.

60. The wafer cooling device of claim 59 wherein said cooling disk is soldered or brazed to said backside of said ceramic disk.

61. The wafer cooling device of claim 60 wherein a material used to solder or braze said cooling disk to said backside of said ceramic disk is sufficiently flexible to accommodate a difference in the respective thermal expansion properties of said cooling disk and said ceramic disk.

62. The wafer cooling device of claim 60 wherein said cooling disk is attached to said backside of said ceramic disk with indium solder.

63. The wafer cooling device of claim 59 wherein said cooling disk is fixed in a cavity formed in said metallic support disk.

64. The wafer cooling device of claim 63 wherein said cooling disk is fixed in said cavity with bolts.

65. The wafer cooling device of claim 64 further comprising a first O-ring for sealing said cavity against a vacuum environment surrounding said wafer cooling device and a second O-ring for sealing said cavity against a vacuum environment in said gas inlet channel.

66. A method of controlling the temperature of a substrate which is receiving thermal energy from an external source, said method comprising the steps of:

providing a substrate cooling device which comprises a substrate contact plate having an annular raised ring formed at the periphery thereof and a cavity inside said annular raised ring, said annular raised ring defining a central region comprising an array of protuberances and a recessed region, said recessed region forming said cavity, each of said protuberances terminating in a contact surface;

clamping said substrate to a surface of said annular raised ring;

supplying a gas to said cavity;

controlling the pressure of said gas within said cavity, said pressure of said gas controlling the temperature of said substrate, wherein an area of said recessed region occupies from 80% to 98% of an area of said central region and said contact surfaces have an average roughness (Ra) in the range of 0.35 $\mu$m to 3.0 $\mu$m such that the dominant heat transfer mechanism for removal of said thermal energy from said substrate is through said gas.

67. The method of claim 66 further comprising the step of cooling said substrate contact plate.

68. The method of claim 66 wherein a leakage of said gas flows between said substrate and said surface of said annular raised ring.

* * * * *